United States Patent
Takashima et al.

(10) Patent No.: US 11,219,116 B1
(45) Date of Patent: Jan. 4, 2022

(54) EXTREME ULTRAVIOLET LIGHT GENERATION SYSTEM AND ELECTRONIC DEVICE MANUFACTURING METHOD

(71) Applicant: Gigaphoton Inc., Tochigi (JP)

(72) Inventors: Yuta Takashima, Oyama (JP); Yuichi Nishimura, Oyama (JP); Takayuki Yabu, Oyama (JP); Yoshifumi Ueno, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 17/314,775

(22) Filed: May 7, 2021

(30) Foreign Application Priority Data

Jun. 26, 2020 (JP) .............................. JP2020-110436

(51) Int. Cl.
*H05G 2/00* (2006.01)
*G03F 7/20* (2006.01)

(52) U.S. Cl.
CPC ......... *H05G 2/008* (2013.01); *G03F 7/70025* (2013.01); *G03F 7/70033* (2013.01); *G03F 7/7055* (2013.01)

(58) Field of Classification Search
CPC ... G03F 7/70033; G03F 7/7055; H05G 2/008; H05G 2/005
See application file for complete search history.

(56) References Cited

U.S. PATENT DOCUMENTS

| | | | |
|---|---|---|---|
| 10,122,145 B2 | 11/2018 | Kurosawa et al. | |
| 10,303,061 B2 | 5/2019 | Nishimura et al. | |
| 2012/0228525 A1* | 9/2012 | Moriya | H05G 2/008 250/504 R |
| 2013/0119232 A1 | 5/2013 | Moriya et al. | |
| 2014/0333915 A1* | 11/2014 | Hoogkamp | H01J 37/32339 355/67 |
| 2018/0199422 A1* | 7/2018 | Yabu | H05G 2/006 |

FOREIGN PATENT DOCUMENTS

| | | |
|---|---|---|
| JP | 2012-104861 A | 5/2012 |
| JP | 2016-154156 A | 8/2016 |

OTHER PUBLICATIONS

A Dutch Search Report issued by the Dutch Patent Office dated Nov. 9, 2021, which corresponds to Dutch Patent Application No. 2028171 and is related to U.S. Appl. No. 17/314,775; with partial English language translation.

* cited by examiner

*Primary Examiner* — Steven Whitesell Gordon
(74) *Attorney, Agent, or Firm* — Studebaker & Brackett PC

(57) ABSTRACT

An extreme ultraviolet light generation system may include an irradiation position adjustment mechanism adjusting an irradiation position of the laser light; an extreme ultraviolet light sensor measuring energy of extreme ultraviolet light; a return light sensor measuring energy of return light traveling backward on the laser light path; and a processor controlling the irradiation position adjustment mechanism. The processor stores measurement results of the extreme ultraviolet light energy and the return light energy in association with each of the irradiation positions, limits a shift region of the irradiation position based on comparison between the return light energy and a threshold, and determines a target irradiation position based on the association between the irradiation position and the extreme ultraviolet light energy in a region where the return light energy does not exceed the threshold, and controlling the irradiation position adjustment mechanism in accordance with the target irradiation position.

20 Claims, 22 Drawing Sheets

EUV LIGHT ENERGY [mJ]

FIG. 9

| EUV Energy [mJ] | X [μm] | | | | | | |
|---|---|---|---|---|---|---|---|
| | -60 | -40 | -20 | 0 | 20 | 40 | 60 |
| 60 | 0.458 | 0.929 | 1.234 | 1.795 | 2.008 | 1.882 | 1.468 |
| 40 | 0.889 | 1.495 | 2.132 | 2.371 | 2.339 | 2.053 | 1.624 |
| 20 | 1.374 | 2.103 | 2.401 | 2.503 | 2.474 | 2.205 | 1.679 |
| 0 | 1.703 | 2.189 | 2.516 | 2.529 | 2.447 | 2.124 | 1.537 |
| -20 | 1.808 | 2.126 | 2.363 | 2.473 | 2.437 | 2.208 | 1.524 |
| -40 | 1.629 | 1.789 | 2.084 | 2.253 | 2.303 | 2.216 | 1.608 |
| -60 | 1.411 | 1.408 | 1.771 | 2.189 | 2.22 | 2.226 | 1.747 |
| Y [μm] | | | | | | | |

FIG. 10

| RETURN LIGHT POWER [mJ] | | X [μm] | | | | | | |
|---|---|---|---|---|---|---|---|---|
| | | -60 | -40 | -20 | 0 | 20 | 40 | 60 |
| Y [μm] | 60 | 0.02 | 0.03 | 0.03 | 0.03 | 0.05 | 0.08 | 0.09 |
| | 40 | 0.01 | 0.03 | 0.03 | 0.03 | 0.04 | 0.06 | 0.07 |
| | 20 | 0.01 | 0.02 | 0.02 | 0.03 | 0.03 | 0.05 | 0.07 |
| | 0 | 0.01 | 0.01 | 0.01 | 0.02 | 0.03 | 0.05 | 0.07 |
| | -20 | 0.01 | 0.02 | 0.02 | 0.03 | 0.05 | 0.06 | 0.07 |
| | -40 | 0.02 | 0.03 | 0.03 | 0.04 | 0.06 | 0.08 | 0.08 |
| | -60 | 0.03 | 0.04 | 0.04 | 0.05 | 0.08 | 0.08 | 0.09 |

FIG. 12

| EUV Energy [mJ] \ X [μm] | -60 | -40 | -20 | 0 | 20 | 40 | 60 |
|---|---|---|---|---|---|---|---|
| 60 | 1.74 | 3.53 | 4.69 | 6.82 | — | — | — |
| 40 | 3.38 | 5.68 | 8.1 | 9.01 | 7.63 | — | — |
| 20 | 5.22 | 7.99 | 9.35 | 9.51 | 8.89 | 8.38 | — |
| 0 | 6.47 | 8.32 | 9.56 | 9.61 | 9.4 | 8.07 | — |
| -20 | 6.87 | 8.08 | 8.33 | 9.42 | 9.3 | — | — |
| -40 | 6.19 | 6.8 | 7.92 | 8.50 | 9.26 | — | — |
| -60 | 5.36 | 5.35 | 6.73 | 8.32 | — | — | — |

| Return Light Power [mJ] | X [μm] | | | | | | |
|---|---|---|---|---|---|---|---|
| Y [μm] | -60 | -40 | -20 | 0 | 20 | 40 | 60 |
| 60 | 0.116 | 0.15 | 0.164 | 0.16 | 0.25 | — | — |
| 40 | 0.072 | 0.126 | 0.158 | 0.142 | 0.182 | — | — |
| 20 | 0.044 | 0.116 | 0.094 | 0.128 | 0.146 | 0.27 | — |
| 0 | 0.026 | 0.048 | 0.062 | 0.104 | 0.164 | 0.244 | — |
| -20 | 0.034 | 0.11 | 0.122 | 0.146 | 0.24 | — | — |
| -40 | 0.092 | 0.148 | 0.17 | 0.21 | — | — | — |
| -60 | 0.126 | 0.182 | 0.194 | 0.294 | — | — | — |

FIG. 16

| EUV Energy [mJ] | | X [μm] | | | | | | |
|---|---|---|---|---|---|---|---|---|
| | | -60 | -40 | -20 | 0 | 20 | 40 | 60 |
| Y [μm] | 60 | 1.74 | 3.53 | 4.69 | 6.82 | 7.63 | 7.15 | 5.58 |
| | 40 | 3.38 | 5.68 | 8.1 | 8.01 | 8.89 | 7.8 | 6.17 |
| | 20 | 5.22 | 7.99 | 8.35 | 9.51 | 9.4 | 8.38 | 6.38 |
| | 0 | 6.47 | 8.32 | 9.56 | 9.61 | 9.13 | 8.07 | 5.84 |
| | -20 | 6.87 | 8.08 | 8.93 | 9.42 | 9.26 | 8.39 | 5.79 |
| | -40 | 6.19 | 6.8 | 7.92 | 8.56 | 8.75 | 8.42 | 6.11 |
| | -60 | 5.36 | 5.35 | 6.73 | 8.32 | 8.36 | 8.46 | 6.64 |

FIG. 17

| RETURN LIGHT POWER [mJ] | | X [μm] | | | | | | |
|---|---|---|---|---|---|---|---|---|
| | | -60 | -40 | -20 | 0 | 20 | 40 | 60 |
| Y [μm] | 60 | 0.12 | 0.15 | 0.16 | 0.16 | 0.25 | 0.39 | 0.43 |
| | 40 | 0.07 | 0.13 | 0.16 | 0.14 | 0.18 | 0.32 | 0.34 |
| | 20 | 0.04 | 0.12 | 0.09 | 0.13 | 0.15 | 0.27 | 0.33 |
| | 0 | 0.03 | 0.05 | 0.06 | 0.10 | 0.16 | 0.24 | 0.34 |
| | -20 | 0.03 | 0.11 | 0.12 | 0.15 | 0.24 | 0.32 | 0.35 |
| | -40 | 0.09 | 0.15 | 0.17 | 0.21 | 0.31 | 0.39 | 0.38 |
| | -60 | 0.13 | 0.18 | 0.19 | 0.29 | 0.39 | 0.41 | 0.45 |

FIG. 18

| EUV Energy [mJ] | X [μm] | | | | | | |
|---|---|---|---|---|---|---|---|
| Y [μm] | -60 | -40 | -20 | 0 | 20 | 40 | 60 |
| 60 | 1.74 | 3.53 | 4.69 | 6.82 | 7.63 | – | – |
| 40 | 3.38 | 5.68 | 8.1 | 9.01 | 8.89 | 7.8 | – |
| 20 | 5.22 | 7.99 | 9.35 | 9.51 | 9.4 | 8.38 | – |
| 0 | 6.47 | 8.32 | 9.56 | 9.61 | 9.3 | 8.07 | – |
| -20 | 6.87 | 8.08 | 9.3 | 9.42 | 9.26 | – | – |
| -40 | 6.19 | 6.8 | 7.92 | 8.56 | 8.75 | – | – |
| -60 | 5.36 | 5.35 | 6.73 | 8.32 | – | – | – |

FIG. 19

| RETURN LIGHT POWER [mJ] | | X [μm] | | | | | | |
|---|---|---|---|---|---|---|---|---|
| | | -60 | -40 | -20 | 0 | 20 | 40 | 60 |
| Y [μm] | 60 | 0.12 | 0.15 | 0.16 | 0.16 | 0.25 | – | – |
| | 40 | 0.07 | 0.13 | 0.16 | 0.14 | 0.18 | 0.32 | – |
| | 20 | 0.04 | 0.12 | 0.09 | 0.13 | 0.15 | 0.27 | – |
| | 0 | 0.03 | 0.05 | 0.06 | 0.10 | 0.16 | 0.24 | – |
| | -20 | 0.03 | 0.11 | 0.12 | 0.15 | 0.24 | – | – |
| | -40 | 0.09 | 0.15 | 0.17 | 0.21 | 0.31 | – | – |
| | -60 | 0.13 | 0.18 | 0.19 | 0.29 | – | – | – |

EXTREME ULTRAVIOLET LIGHT GENERATION SYSTEM AND ELECTRONIC DEVICE MANUFACTURING METHOD

CROSS-REFERENCE TO RELATED APPLICATIONS

The application claims the benefit of Japanese Unexamined Patent Application No. 2020-110436, filed on Jun. 26, 2020, the entire contents of which are hereby incorporated by reference.

BACKGROUND

1. Technical Field

The present disclosure relates to an extreme ultraviolet light generation system and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 10 nm or less will be required. Therefore, the development of an exposure apparatus that combines an extreme ultraviolet (EUV) light generation apparatus that generates EUV light having a wavelength of about 13 nm and reduced projection reflection optics is expected.

As the EUV light generation apparatus, a laser produced plasma (LPP) type apparatus using plasma generated by irradiating a target substance with laser light has been developed.

LIST OF DOCUMENTS

Patent Documents

Patent Document 1: Japanese Patent Application Publication No. 2012-104861
Patent Document 2: U.S. patent Ser. No. 10/303,061
Patent Document 3: U.S. patent Ser. No. 10/122,145

SUMMARY

An extreme ultraviolet light generation system according to an aspect of the present disclosure includes a chamber, a target supply unit configured to supply a target to a predetermined region in the chamber, a laser device configured to emit laser light to be radiated to the target, an optical system which forms a laser light path for guiding the laser light to the predetermined region, an irradiation position adjustment mechanism configured to adjust an irradiation position of the laser light with respect to the target in a plane being perpendicular to an optical path axis of the laser light traveling toward the predetermined region and intersecting the predetermined region, an extreme ultraviolet light sensor configured to measure energy of extreme ultraviolet light generated by irradiating the target with the laser light, a return light sensor configured to measure energy of return light traveling backward on the laser light path among reflected light of the laser light by the target, and a processor configured to control the irradiation position adjustment mechanism. Here, the processor stores measurement results of the extreme ultraviolet light energy measured by the extreme ultraviolet light sensor and the return light energy measured by the return light sensor in association with each of the irradiation positions as causing the irradiation position to shift in the plane and causing the laser light to be radiated to the irradiation position, limits a shift region of the irradiation position based on comparison between the return light energy and a threshold, determining a target irradiation position based on the stored association between the irradiation position and the extreme ultraviolet light energy in a region where the return light energy does not exceed the threshold, and controls the irradiation position adjustment mechanism in accordance with the target irradiation position.

An electronic device manufacturing method according to an aspect of the present disclosure includes generating extreme ultraviolet light using an extreme ultraviolet light generation system, emitting the extreme ultraviolet light to an exposure apparatus, and exposing a photosensitive substrate to the extreme ultraviolet light in the exposure apparatus to manufacture an electronic device. Here, the extreme ultraviolet light generation system includes a chamber, a target supply unit configured to supply a target to a predetermined region in the chamber, a laser device configured to emit laser light to be radiated to the target, an optical system which forms a laser light path for guiding the laser light to the predetermined region, an irradiation position adjustment mechanism configured to adjust an irradiation position of the laser light with respect to the target in a plane being perpendicular to an optical path axis of the laser light traveling toward the predetermined region and intersecting the predetermined region, an extreme ultraviolet light sensor configured to measure energy of extreme ultraviolet light generated by irradiating the target with the laser light, a return light sensor configured to measure energy of return light traveling backward on the laser light path among reflected light of the laser light by the target, and a processor configured to control the irradiation position adjustment mechanism. The processor stores measurement results of the extreme ultraviolet light energy measured by the extreme ultraviolet light sensor and the return light energy measured by the return light sensor in association with each of the irradiation positions as causing the irradiation position to shift in the plane and causing the laser light to be radiated to the irradiation position, limits a shift region of the irradiation position based on comparison between the return light energy and a threshold, determining a target irradiation position based on the stored association between the irradiation position and the extreme ultraviolet light energy in a region where the return light energy does not exceed the threshold, and controls the irradiation position adjustment mechanism in accordance with the target irradiation position.

BRIEF DESCRIPTION OF THE DRAWINGS

Embodiments of the present disclosure will be described below merely as examples with reference to the accompanying drawings.

FIG. 9 illustrates an example of an EUV energy distribution chart with low power laser irradiation.

FIG. 10 illustrates an example of a return light power distribution chart with low power laser irradiation.

FIG. 12 illustrates an example of an EUV energy distribution chart with high power laser irradiation.

FIG. 13 illustrates an example of a return light power distribution chart with high power laser irradiation.

FIG. 16 illustrates an example of an EUV energy distribution chart obtained when irradiation of laser light is performed without limitation of a scanning region of irradiation positions.

FIG. 17 illustrates an example of a return light power distribution chart obtained when irradiation of laser light is performed without limitation of the scanning region of the irradiation positions.

FIG. 18 illustrates an example of the EUV energy distribution chart obtained when a second return light threshold is provided for return light power to limit an adjustment range at the time of high power irradiation position adjustment according to the second embodiment.

FIG. 19 illustrates an example of the return light power distribution chart obtained when the second return light threshold is provided for the return light power to limit the adjustment range at the time of high power irradiation position adjustment according to the second embodiment.

DESCRIPTION OF EMBODIMENTS

Figure 1:
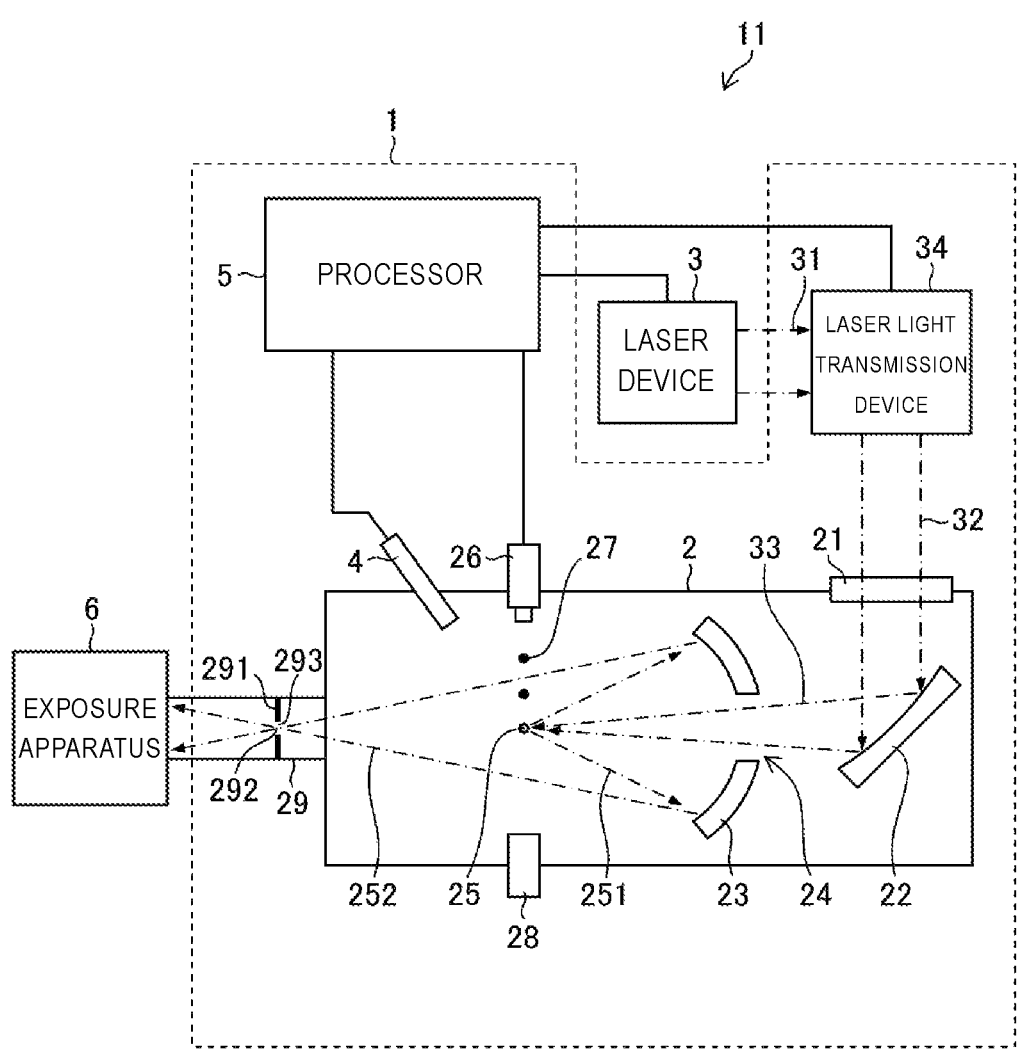
FIG. 1 schematically illustrates an exemplary configuration of an LPP EUV light generation system.

<Contents>
1. Description of Terms
2. Overall description of EUV light generation system
    2.1 Configuration
    2.2 Operation
3. Outline of EUV light generation system according to comparative example
    3.1 Configuration
    3.2 Operation
    3.3 Outline of laser irradiation position adjustment
    3.4 Example of irradiation position adjustment process
    3.5 Problem
4. First Embodiment
    4.1 Configuration
    4.2 Operation
    4.3 Examples of EUV energy distribution chart and return light power distribution chart
    4.4 Effect
5. Second Embodiment
    5.1 Configuration
    5.2 Operation
    5.3 Examples of EUV energy distribution chart and return light power distribution chart
        5.3.1 Example of distribution chart when scanning region of irradiation positions is not limited
        5.3.2 Example of distribution chart when scanning region is limited by providing threshold in return light power
    5.4 Effect
6. Third Embodiment
    6.1 Configuration
    6.2 Operation
    6.3 Example of laser irradiation position adjustment
        6.3.1 Prepulse laser irradiation position adjustment
        6.3.2 Main pulse laser irradiation position adjustment
    6.4 Effect
7. Example of electronic device manufacturing method using EUV light generation system
8. Others Hereinafter, embodiments of the present disclosure will be described in detail with reference to the drawings. The embodiments described below illustrate some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. Description of Terms

A "target" is an object to be irradiated with laser light introduced into the chamber. The target irradiated with laser light becomes plasma and emits EUV light.

A "droplet" is a form of a target supplied into the chamber. The droplet may refer to a droplet-shaped target having a substantially spherical shape due to surface tension of a molten target substance.

A "plasma generation region" is a predetermined area in the chamber. The plasma generation region is a region in which a target output into the chamber is irradiated with laser light and the target is turned into plasma.

"Pulse laser light" may refer to laser light including a plurality of pulses. A "laser light path" is an optical path of laser light. An "upstream" side of the laser light path refers to a side closer to a light source of the laser light in the laser light path.

An "optical path axis" is an axis passing through the center of a beam cross section of the laser light along a traveling direction of the laser light. An "optical path" is a path through which the laser light passes. The optical path may include an optical path axis.

A "Z-axis direction" is a traveling direction of the laser light when the laser light introduced into the chamber travels toward the plasma generation region 25. The Z-axis direction may be substantially the same as a direction in which the EUV light generation apparatus emits EUV light.

A "Y-axis direction" is a direction opposite to a direction in which the target supply unit outputs a target into the chamber, and is a direction perpendicular to the Z-axis direction. An "X-axis direction" is a direction perpendicular to the Y-axis direction and the Z-axis direction.

The expression "EUV light" is an abbreviation for "extreme ultraviolet light." An "extreme ultraviolet light generation system" is referred to as an "EUV light generation system."

The term "parallel" in the present specification may include a concept of substantially parallel which can be regarded as a range equivalent to substantially parallel in technical meaning. In addition, the term "perpendicular" or "orthogonal" in the present specification may include a concept of substantially perpendicular or substantially orthogonal which can be regarded as a range equivalent to substantially perpendicular or substantially orthogonal in technical meaning.

2. Overall Description of EUV Light Generation System

2.1 Configuration

FIG. 1 schematically illustrates an exemplary configuration of an LPP EUV light generation system 11. An EUV light generation apparatus 1 is used with a laser device 3. In the present disclosure, a system including the EUV light generation apparatus 1 and the laser device 3 is referred to as an EUV light generation system 11. The EUV light generation apparatus 1 includes a chamber 2 and a target supply unit 26. The chamber 2 is a sealable container. A target supply unit 26 supplies a target substance into the chamber 2. The material of the target substance may include tin, terbium, gadolinium, lithium, xenon, or a combination of any two or more thereof.

A through hole is formed in a wall of the chamber 2. The through hole is blocked by a window 21 through which pulse laser light 32 emitted from the laser device 3 passes. An EUV light concentrating mirror 23 having a spheroidal reflection surface is disposed in the chamber 2. The EUV light concentrating mirror 23 has first and second focal points. A multilayer reflection film in which molybdenum and silicon are alternately stacked is formed on a surface of the EUV light concentrating mirror 23. The EUV light concentrating mirror 23 may be disposed so that the first focal point is located in a plasma generation region 25 and the second focal point is located at an intermediate focal point 292. A through hole 24 is formed at the center of the EUV light concentrating mirror 23, and pulse laser light 33 passes through the through hole 24.

The EUV light generation apparatus 1 includes a processor 5, a target sensor 4, and the like. The target sensor 4 detects at least one of the presence, trajectory, position, and velocity of the target 27. The target sensor 4 may have an imaging function.

Further, the EUV light generation apparatus 1 includes a connection portion 29 providing communication between an internal space of the chamber 2 and an internal space of an exposure apparatus 6. A wall 291 in which an aperture 293 is formed is provided in the connection portion 29. The wall 291 is arranged so that the aperture 293 is located at the second focal point of the EUV light concentrating mirror 23.

Furthermore, the EUV light generation apparatus 1 includes a laser light transmission device 34, a laser light concentrating mirror 22, a target collection unit 28 for collecting the target 27, and the like. The laser light transmission device 34 includes an optical element for defining a traveling direction of laser light, and an actuator for adjusting the position, posture, and the like of the optical element.

2.2 Operation

Operation of an exemplary LPP type EUV light generation system 11 will be described with reference to FIG. 1. Pulse laser light 31 emitted from the laser device 3 enters, via the laser light transmission device 34, the chamber 2 through the window 21 as the pulse laser light 32. The pulse laser light 32 travels along a laser light path in the chamber 2, is reflected by the laser light concentrating mirror 22, and is radiated to the target 27 as the pulse laser light 33.

The target supply unit 26 outputs the target 27 formed of a target substance toward the plasma generation region 25 in the chamber 2. The target 27 is irradiated with the pulse laser light 33. The target 27 irradiated with the pulse laser light 33 is turned into plasma, and radiation light 251 is radiated from the plasma. EUV light 252 contained in the radiation light 251 is selectively reflected by the EUV light concentrating mirror 23. The EUV light 252 reflected by the EUV light concentrating mirror 23 is concentrated at the intermediate focal point 292 and output to the exposure apparatus 6. Here, one target 27 may be irradiated with a plurality of pulses included in the pulse laser light 33.

The processor 5 controls the entire EUV light generation system 11. The processor 5 processes a detection result of the target sensor 4. Based on the detection result of the target sensor 4, the processor 5 may control timing at which the target 27 is output, an output direction of the target 27, and the like. Further, the processor 5 may control oscillation timing of the laser device 3, a traveling direction of the pulse laser light 32, the concentration position of the pulse laser light 33, and the like. Such various kinds of control described above are merely exemplary, and other control may be added as necessary.

3. Outline of EUV Light Generation System According to Comparative Example

3.1 Configuration

Figure 2:
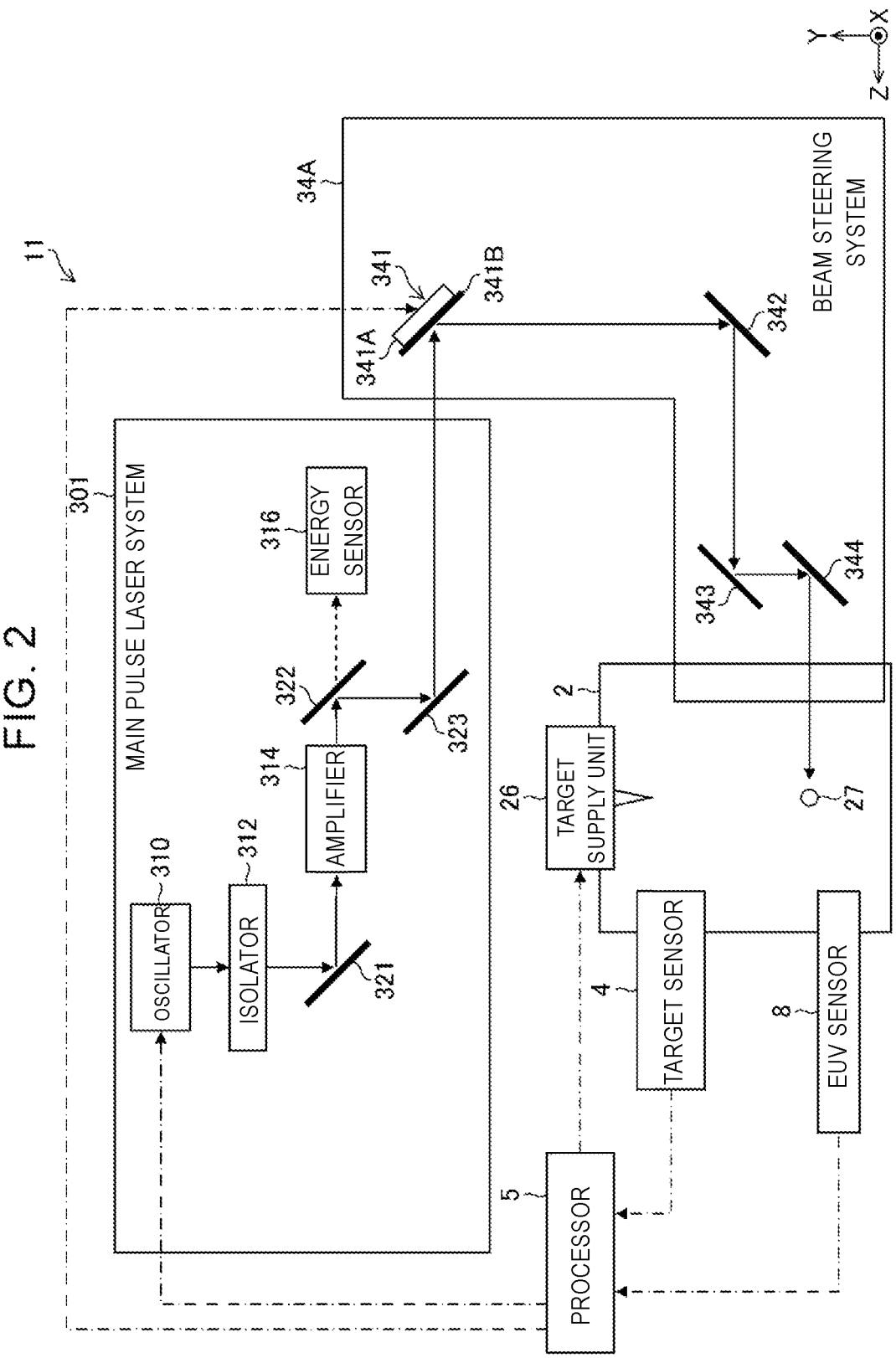
FIG. 2 schematically illustrates a configuration of an EUV light generation system according to a comparative example.

FIG. 2 schematically illustrates a configuration of an EUV light generation system 11 according to a comparative example. The comparative example of the present disclosure is an example recognized by the applicant as known only by the applicant, and is not a publicly known example admitted by the applicant.

The EUV light generation system 11 includes a chamber 2, a main pulse laser system 301, a beam steering system 34A, and a processor 5. The main pulse laser system 301 includes an oscillator 310, an isolator 312, an amplifier 314, and an energy sensor 316.

The main pulse laser system 301 further includes a high reflection mirror 321, a beam splitter 322, a high reflection mirror 323, and other optical elements (not illustrated) on the laser light path. The optical elements, such as mirrors, are configured to transmit and/or shape laser light. The oscillator 310 and the amplifier 314 constitute a master oscillator power amplifier (MOPA). The main pulse laser system 301 is an exemplary laser device 3.

The isolator 312 is disposed on a laser light path from the oscillator 310 to the amplifier 314, and is configured to transmit (i.e., open) and block (i.e., close) the laser light according to an instruction from the processor 5. The isolator 312 may be, for example, a Pockels cell including an electro-optic (EO) element or an acousto-optic (AO) element.

The beam splitter 322 reflects a part of the pulse laser light output from the amplifier 314 toward the high reflection mirror 323, and transmits another part of the pulse laser light output from the amplifier 314 toward the energy sensor 316. The energy sensor 316 is disposed on the optical path of the pulse laser light transmitted through the beam splitter 322. The energy sensor 316 measures the energy of the pulse laser light transmitted through the beam splitter 322 and transmits the measurement value to the processor 5.

The beam steering system 34A is configured to irradiate the target 27 in the chamber 2 with the laser light output from the amplifier 314. The beam steering system 34A includes an actuator-equipped high reflection mirror 341 and high reflection mirrors 342, 343, 344. The beam steering system 34A includes a laser focusing optical system (not illustrated). The laser light concentrating optical system may include a convex mirror and a laser light concentrating mirror. The convex mirror may be an elliptical mirror. The laser light concentrating mirror may be an off-axis parabolic mirror. A part or all of the laser light concentrating optical system may be disposed in the chamber 2.

The actuator-equipped high reflection mirror 341 is configured to be capable of driving an actuator 341A in response to an instruction from the processor 5 and controlling the position and/or orientation of a high reflection mirror 341B. The high reflection mirror 341B is a mirror that highly reflects light having a wavelength of the main pulse laser light emitted from the main pulse laser system 302. The actuator-equipped high reflection mirror 341 may be disposed in the laser light concentrating optical system, and may also serve as a laser light concentrating mirror.

The chamber 2 includes a target supply unit 26, a target sensor 4, an EUV sensor 8, and an EUV light concentrating mirror (not illustrated). The EUV sensor 8 may be an energy sensor that measures energy of EUV light.

The processor 5 is connected to the target supply unit 26, the target sensor 4, the EUV sensor 8, the oscillator 310, the isolator 312, the energy sensor 316, and the actuator 341A.

The processor 5 of the present disclosure is a processing device including a storage device in which a control program is stored and a central processing unit (CPU) that executes the control program. The processor 5 is specifically configured or programmed to perform various processes included in the present disclosure.

3.2 Operation

For emitting the EUV light, the processor 5 causes the target supply unit 26 to output the target 27 in response to an EUV light output command from the exposure apparatus 6. The processor 5 may then receive target EUV energy from the exposure apparatus 6.

The target supply unit 26 is configured to output the target 27 formed of a target substance toward the plasma generation region 25 in the chamber 2. The target supply unit 26 generates droplets as the target 27 by, for example, a continuous jet method.

The target sensor 4 detects the target 27 and outputs a passage timing signal to the processor 5.

The processor 5 outputs a light emission trigger signal generated by adding a predetermined delay time to the passage timing signal to the oscillator 310 and the isolator 312 of the main pulse laser system 301.

The oscillator 310 emits laser light when the light emission trigger signal is input, and the isolator 312 transmits the laser light in synchronization with the arrival timing of the laser light emitted from the oscillator 310. Prior to the above, the processor 5 sets the amplifier 314 in a state capable of amplifying the laser light.

The laser light transmitted through the isolator 312 is amplified by the amplifier 314 and radiated to the target 27 in the chamber 2 after passing through the beam steering system 34A. The energy of laser light emitted from the main pulse laser system 301 reaches several kW to several tens of kW.

The target 27 irradiated with the concentrated laser light is turned into plasma and emits EUV light. At this time, the irradiation diameter (spot diameter) of the laser light with which the target 27 is irradiated may be larger than the diameter of the target 27.

The EUV sensor 8 detects energy of the generated EUV light and transmits the detected energy to the processor 5. The processor 5 may adjust the energy of the laser light by the oscillator 310 and/or the amplifier 314 so that the detected EUV energy becomes the target EUV energy.

3.3 Outline of Laser Irradiation Position Adjustment

The EUV light generation system 11 adjusts the irradiation position of the laser light with respect to the target 27 to generate EUV light with high conversion efficiency. This adjustment operation may be performed before EUV light is output to the exposure apparatus 6. The processor 5 records the EUV energy while scanning the irradiation positions of the laser light in the XY plane by driving the actuator-equipped high reflection mirror 341. Hereinafter, the expression "XY plane" with respect to the irradiation position adjustment means an XY plane intersecting the plasma generation region 25.

Figure 4:
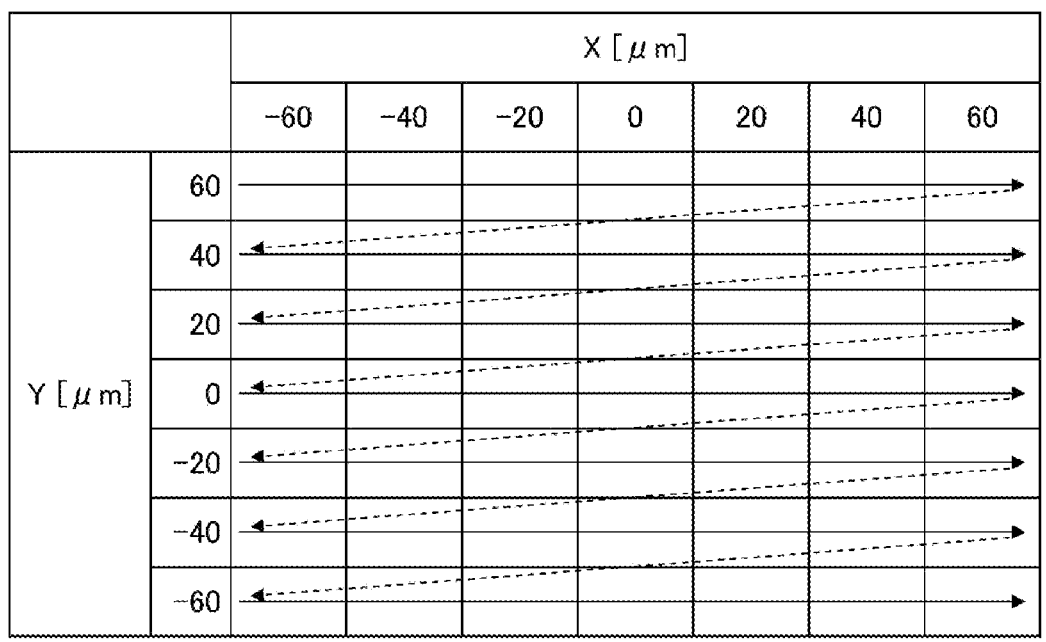
FIG. 4 is a chart illustrating an exemplary irradiation position level group applied to the irradiation position adjustment process illustrated in FIG. 3.

For example, as illustrated in FIG. 4, which will be described later, irradiation position levels defined in a 7×7 matrix in the XY plane having seven irradiation position levels in the X-axis direction and seven irradiation position levels in the Y-axis direction may be used. The levels may be defined with the laser irradiation position set in the past as the origin (center), or may be defined with the optimum position in design as the origin. The range (region) in which the irradiation positions are scanned in each of the X-axis direction and the Y-axis direction, the step width of levels, the number of levels, and the like are not limited to the example illustrated in FIG. 4. The step width of levels or the number of levels may be different between the X-axis direction and the Y-axis direction. A group of levels defining the scanning region of the irradiation positions as illustrated in FIG. 4 is referred to as an "irradiation position level group." The position on the XY plane is represented by coordinates (x,y).

When adjusting the irradiation position of the laser light, the processor 5 controls the actuator-equipped high reflection mirror 341 so that the irradiation positions of the laser light are scanned on the XY plane intersecting the plasma generation region 25. Then, the processor 5 acquires the measurement result of the EUV sensor 8 for each irradiation position.

That is, the processor 5 irradiates the irradiation positions defined by the irradiation position levels with the laser light, and records the detected EUV energy in association with each irradiation position. The EUV energy recorded for each irradiation position may be an average value of a plurality of pulses or a plurality of bursts. The processor 5 repeats the operation of obtaining the measurement value of the EUV energy by driving the actuator 341A so that irradiation of the laser light is performed at a subsequent irradiation position after irradiation of the laser light is performed at a certain irradiation position. The processor 5 sequentially obtains the measurement value of the EUV energy for each position (each level) of the matrix of the irradiation position level group, and maps the measurement results. "Mapping" here includes creating a distribution chart of the EUV energy. The EUV energy distribution chart is a map image of the association between each irradiation position and the EUV energy.

An irradiation position at which high EUV energy can be realized is selected from the EUV energy distribution chart obtained in this way and set as a laser irradiation position. At this time, the processor 5 may specify the irradiation position at which the highest EUV energy can be realized by curve fitting or the like.

3.4 Example of Irradiation Position Adjustment Process

Figure 3:
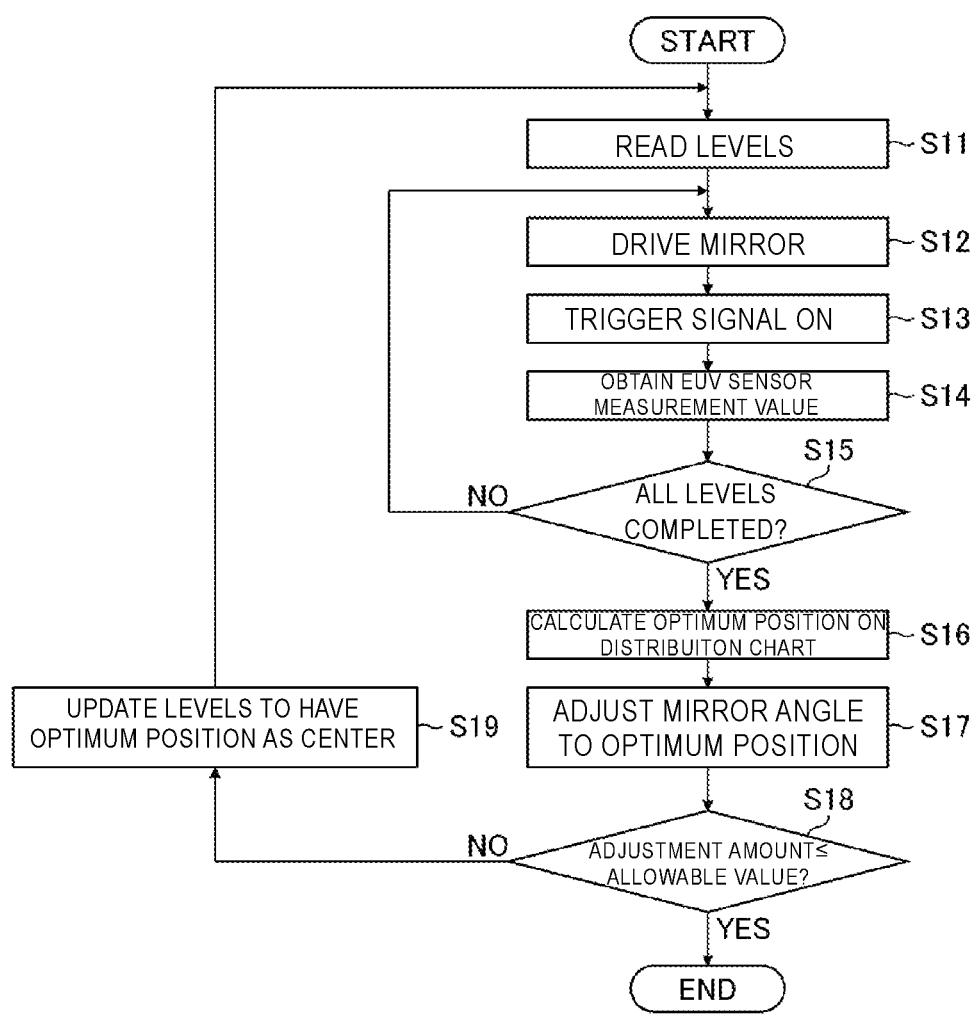
FIG. 3 is a flowchart illustrating an example of an irradiation position adjustment process.
Figure 5:
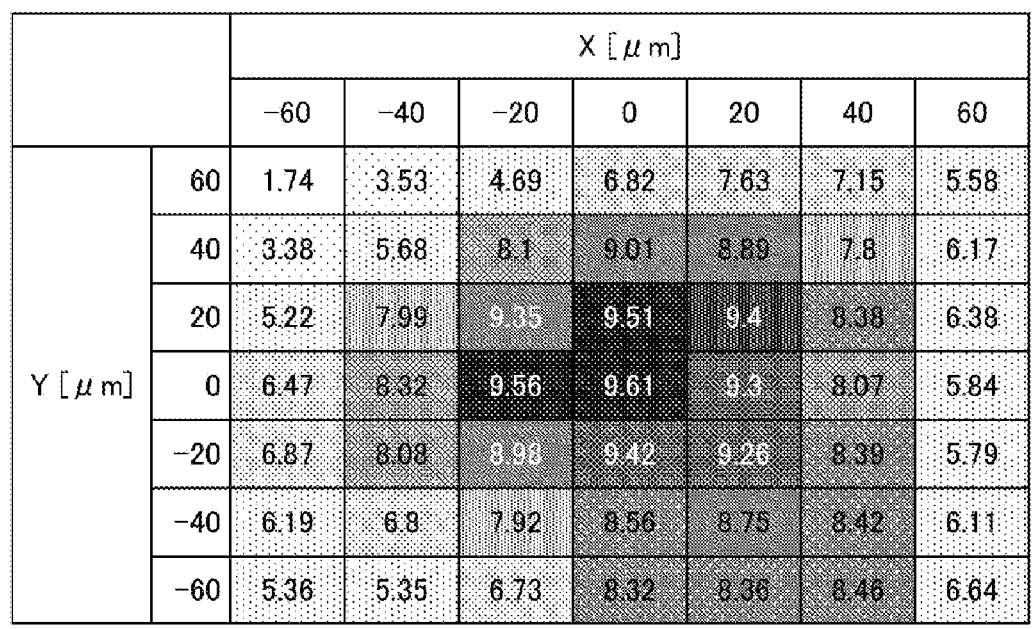
FIG. 5 is a chart illustrating an exemplary EUV energy distribution chart created based on the irradiation position level group illustrated in FIG. 4.
Figure 6:
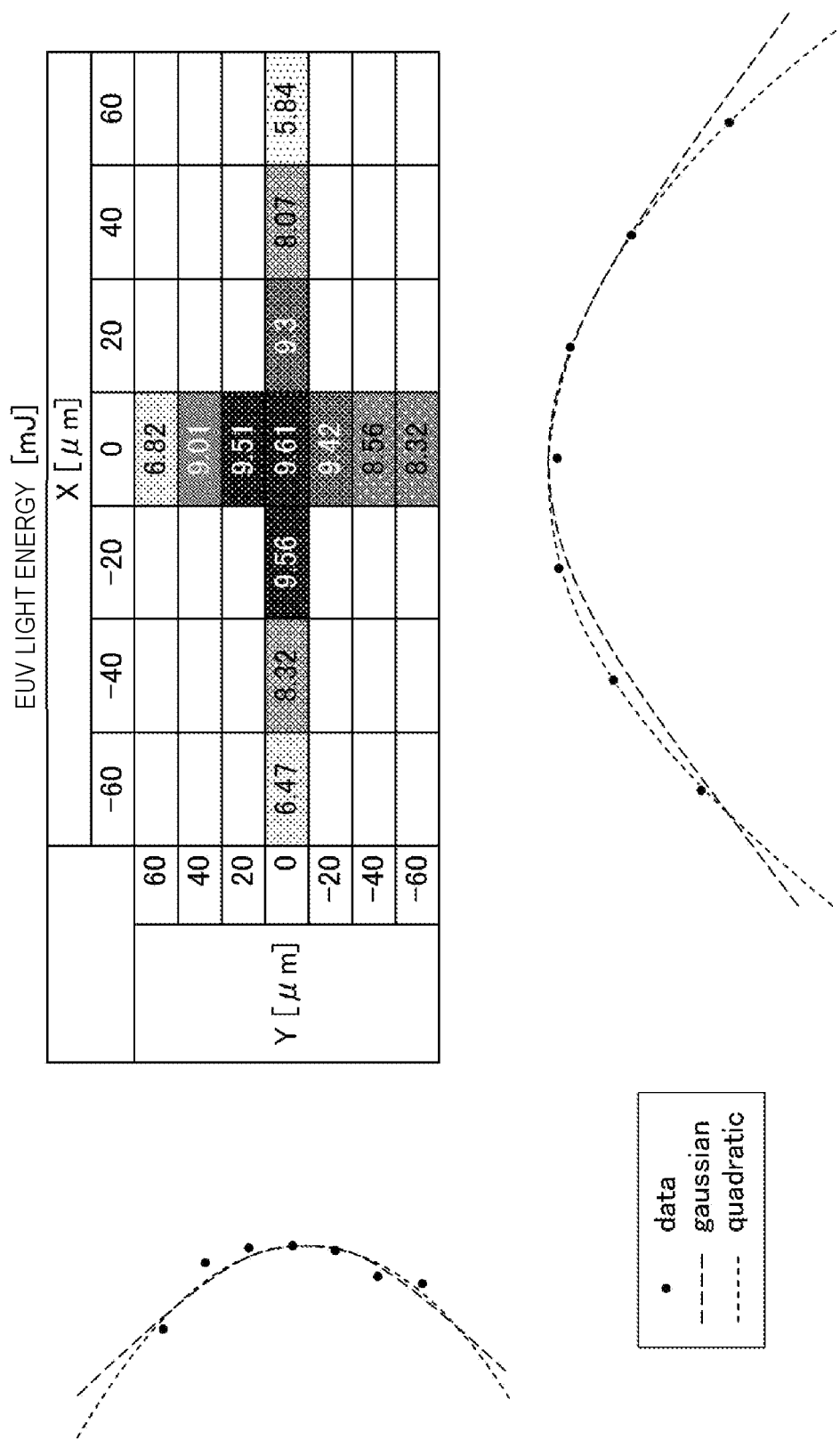
FIG. 6 is a chart illustrating an exemplary approximate curve obtained from the EUV energy distribution chart illustrated in FIG. 5.

An example of an irradiation position adjustment process will be described with reference to FIGS. 3 to 6. FIG. 3 is a flowchart illustrating an example of the irradiation position adjustment process. FIG. 4 is a chart illustrating an irradiation position level group applied to the irradiation position adjustment process illustrated in FIG. 3. FIG. 5 is an exemplary chart illustrating an EUV energy distribution chart created based on the irradiation position level group illustrated in FIG. 4. FIG. 6 is a chart illustrating approximate curves derived from the EUV energy distribution chart illustrated in FIG. 5.

In step S11 of FIG. 3, the processor 5 reads the irradiation position levels. Specifically, for example, when scanning the irradiation positions Sm(x,y) of the laser light, the processor 5 performs scanning based on the irradiation position level group as illustrated in FIG. 4. The arrows in FIG. 4 indicate the shift order of the positions to be irradiated with the laser light by scanning, that is, the progression order of the levels by scanning. For example, the processor 5 adjusts the irradiation position by causing the irradiation position to shift in the Y-axis direction after causing the irradiation position to shift in the X-axis direction in accordance with the irradiation position levels in the two-dimensional array as illustrated in FIG. 4.

As illustrated in FIG. 4, the irradiation position level group may be created using a table arranged in a matrix with Sm(0,0) as the center before adjustment. FIG. 4 illustrates an example in which the irradiation position level is defined in seven stages from "−60 µm" to "+60 µm" with a step width of "20 µm" in each direction of the X-axis direction and the Y-axis direction with Sm(0,0) as the center, and the irradiation position shifts in a range of 49 irradiation position levels arranged in a 7×7 matrix.

The processor 5 may hold a plurality of irradiation position level groups in advance, and read the irradiation position level to be applied according to an output condition of the laser light and a spot diameter D. The processor 5 may hold and apply a plurality of irradiation position level groups according to the output condition of the laser light and the spot diameter D.

In step S12, the processor 5 drives the actuator-equipped high reflection mirror 341 based on the read irradiation position levels. That is, the processor 5 drives the actuator 341A of the actuator-equipped high reflection mirror 341 so that the irradiation positions Sm(x,y) is scanned.

In step S13, the processor 5 generates the EUV light 252 by transmitting a trigger signal to the main pulse laser system 301 in synchronization with the passage timing signal.

In step S14, the processor 5 obtains the measurement result of the EUV sensor 8.

The processor 5 may statistically process a plurality of measurement values transmitted from the plurality of EUV sensors 8 to obtain the energy of the EUV light 252 and the variation thereof as necessary. The energy of the EUV light 252 may be an average value of a plurality of measurement values transmitted from the plurality of EUV sensors 8. The energy variation of the EUV light 252 may be, for example, 3σ, where σ is a standard deviation.

The processor 5 obtains the energy of the EUV light 252 and the variation thereof as the measurement result of the EUV sensor 8 and stores them in association with each irradiation position level.

To obtain the measurement result of the EUV sensor 8 at one irradiation position level, the processor 5 may generate the EUV light 252 having 100 pulses or more and 100,000 pulses or less. The operation condition of the EUV light generation apparatus 1 for generating 100,000 pulses of the EUV light 252 may be such that the duty cycle is 50%, the number of pulses of the EUV light 252 per burst is 10,000, and the EUV light generation apparatus 1 is operated for 10 bursts. Here, the burst may be an operation of the EUV light generation apparatus 1 in which the EUV light 252 is generated at a predetermined repetition frequency for a predetermined period of time. The duty cycle may be a ratio of the predetermined time, for which the EUV light 252 is generated at a predetermined repetition frequency, to a unit time.

In step S15, the processor 5 determines whether or not all the irradiation position levels included in the read irradiation position level group have been scanned.

When the determination result of step S15 is NO, that is, when the scanning of all the irradiation position levels is not completed, the processor 5 returns to step S12.

By repeating steps S12 to S15, the EUV energy measurement value (the measurement result of the EUV sensor 8) for each irradiation position level is accumulated. The processor 5 creates the energy distribution chart of the EUV light 252 based on the measurement results of the EUV sensor 8 stored in association with each irradiation position level.

On the other hand, when the determination result of step S15 is YES, that is, when all the irradiation position levels have been scanned, the processor 5 proceeds to step S16.

In the case of proceeding to step S16, the energy distribution chart of the EUV light 252 as exemplified in FIG. 5 is obtained based on the measurement results of the EUV sensor 8 stored in association with each irradiation position level. The processor 5 may sequentially proceed with the creation of the distribution chart in the course of repeating steps S12 to S15, or may create the distribution chart at a stage when the determination result of step S15 becomes YES.

FIG. 5 is an exemplary distribution chart in which the value of the EUV average energy is input to a cell at each irradiation position Sm(x,y). Here, the unit of the EUV average energy is [mJ]. The numerical value illustrated in the cell at each irradiation position in FIG. 5 represents the average energy at the energy center of gravity position calculated from the plurality of measurement results of the EUV sensor 8. The distribution chart as illustrated in FIG. 5 is referred to as an "EUV energy distribution chart."

In step S16 of FIG. 3, the processor 5 calculates an optimum position Smopt(x,y) of the irradiation positions Sm(x,y) of the laser light based on the obtained EUV energy distribution chart, and stores the optimum position. For example, the processor 5 may determine the optimum position Smopt(x,y) by numerical analysis using data of the created EUV energy distribution chart. For example, as illustrated in FIG. 6, the processor 5 may specify, as analysis targets, the irradiation position level at which the energy of the EUV light 252 is maximum, the irradiation position levels in the vicinity thereof, and the energy of the EUV light 252 associated with each irradiation position level.

Then, the processor 5 may approximate the energy distribution of the EUV light 252 to a Gaussian distribution curve or a quadratic curve using, for example, a least squares method. The processor 5 may determine the X coordinate and the Y coordinate corresponding to the maximum value of the approximate curve as the optimum position Smopt(x, y). The optimum position Smopt(x,y) is set as the target irradiation position and is stored in a memory in the processor 5.

Instead of the calculation method of the optimum position as illustrated in FIG. 6, the processor 5 may determine, as the optimum position Smopt(x,y), the irradiation position Sm(x, y) of the irradiation position level at which the energy of the EUV light 252 is maximum in the created EUV energy distribution chart.

In step S17, the processor 5 adjusts the mirror angle of the actuator-equipped high reflection mirror 341 so that the laser light is radiated to the optimum position Smopt(x,y). Specifically, the processor 5 drives the actuator 341A so that the laser irradiation position becomes the optimum position Smopt(x,y). Thus, the irradiation position Sm of the laser light is adjusted to the optimum position Smopt.

In step S18, the processor 5 determines whether or not the adjustment amount of the actuator-equipped high reflection mirror 341 is equal to or less than an allowable value Rm.

The processor 5 may set the absolute value |Sma-Smb| of the difference between an irradiation position Sma of the laser light after the adjustment and an irradiation position Smb of the laser light before the adjustment as the adjustment amount of the actuator-equipped high reflection mirror 341.

When the adjustment amount of the actuator-equipped high reflection mirror 341 is equal to or less than the allowable value Rm, the processor 5 may end the process. The allowable value Rm may be determined, for example, in correlation with the spot diameter D. On the other hand, when the adjustment amount of the actuator-equipped high reflection mirror 341 exceeds the allowable value Rm, the processor 5 proceeds to step S19.

In step S19, the processor 5 updates the current irradiation position level group to an irradiation position level group to have the optimum position Smopt as the center, and returns to step S11.

3.5 Problem

The laser irradiation position adjustment is performed so that the EUV performance (EUV energy) is enhanced within a range where the distance from the origin position in the XY plane is Rm or less. Since the irradiation position level scanning during the adjustment is performed without limitation also in a direction in which return light increases, there is a risk that the laser light is radiated at a level where the return light power becomes excessive and element damage occurs. The return light is reflected light of the laser light by the target 27 and travels backward along the laser light path toward the oscillator 310. In many cases, the return light does not cause a problem because it is attenuated during propagation. However, depending on conditions, the return light may travel backward through the amplifier 314 to be amplified and may damage the isolator 312 and the like.

4. First Embodiment 4.1 Configuration

Figure 7:
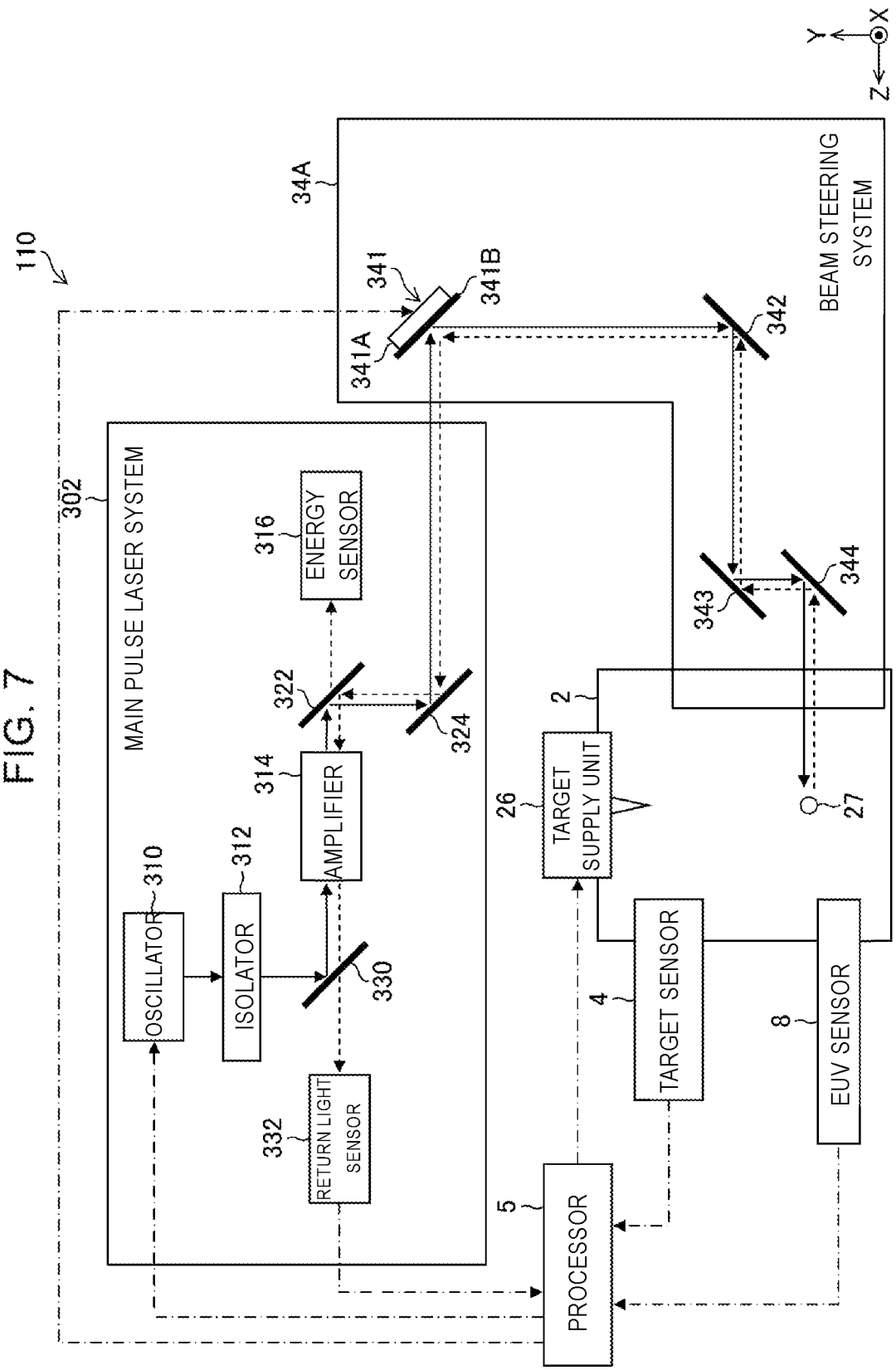
FIG. 7 schematically illustrates an exemplary configuration of an EUV light generation system according to a first embodiment.

FIG. 7 schematically illustrates an exemplary configuration of an EUV light generation system 110 according to a first embodiment. The configuration illustrated in FIG. 7 will be described in terms of differences from the configuration illustrated in FIG. 2. The EUV light generation system 110 according to the first embodiment includes a main pulse laser system 302 instead of the main pulse laser system 301 illustrated in FIG. 2. The main pulse laser system 302 includes the oscillator 310, the isolator 312, the beam splitter 330, a return light sensor 332, the amplifier 314, the energy sensor 316, the beam splitter 322, and the high reflection mirror 324.

The beam splitter 330 is placed instead of any high reflection mirror between the isolator 312 and the amplifier 314. For example, the beam splitter 330 is disposed instead of the high reflection mirror 321 illustrated in FIG. 2. The beam splitter 330 is configured to transmit a part of the light traveling backward along the laser light path, transmit a part of the incident laser light, and reflect another part of the incident laser light.

The return light sensor 332 is disposed at a position where it receives light having passed through the beam splitter 330 in the backward direction of the laser light path. An optical system (not illustrated) may be disposed between the beam splitter 330 and the return light sensor 332. The optical system may be a collimating optical system or a concentrating optical system. The return light sensor 332 is, for example, an energy sensor that performs energy measurement. Here, a power sensor that performs power measurement may be used as the return light sensor 332. The energy or power of the return light is referred to as "return light power." The return light power may be referred to as "return light intensity" instead. The return light sensor 332 transmits a detection value of the return light power to the processor 5.

4.2 Operation

With EUV light generation system 110 according to the first embodiment, when adjusting the irradiation position of the laser light, the pulse energy of the laser light with which the target 27 is irradiated is set to relatively low energy (low power), the irradiation position levels are scanned using the low power laser light, and a distribution chart of the return light power is created. Based on the return light power distribution chart of low power thus obtained, the scanning region is limited at the time of the irradiation position adjustment using the laser light of high energy (high power). The scanning region is a shift region of the irradiation position.

Figure 8:
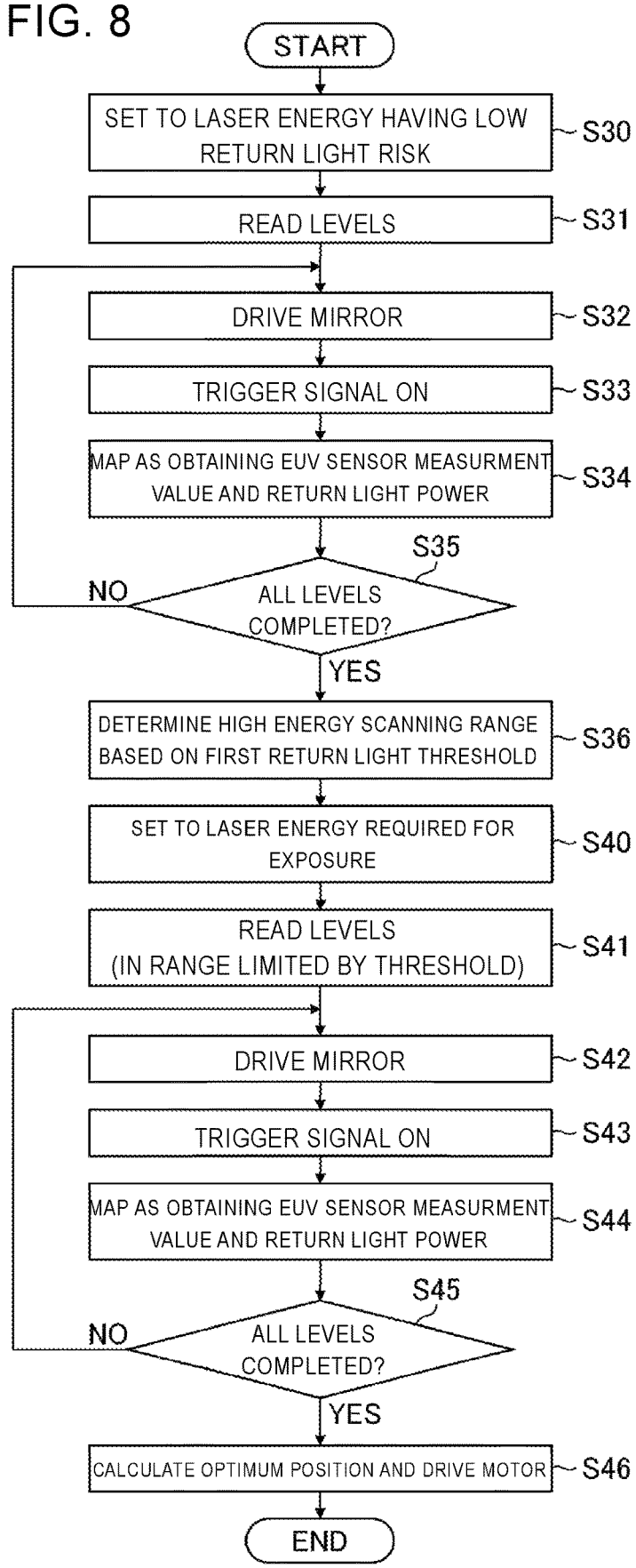
FIG. 8 is a flowchart illustrating an example of an irradiation position adjustment process of laser light in the EUV light generation system.

FIG. 8 is a flowchart illustrating an example of an irradiation position adjustment process of laser light in the EUV light generation system 110. In step S30, the processor 5 sets the laser light energy to a value of the laser energy at which the risk due to the return light is low. The processor 5 sends a signal to the oscillator 310 to set the energy of the laser light to a low value. The low energy set value at this time is set to be lower than the laser energy value (power at exposure) required at the time of exposure by the exposure apparatus 6. The low energy set value is set to a laser energy value that does not exceed the laser proof strength (laser resistance strength) of an optical element upstream of the amplifier 314 even in the case of the assumed maximum return light power. For example, it is preferable to set the power to about 25% to 30% with respect to the rated power, and in the case of the laser device 3 in which the power at exposure is 20 kW, the low energy set value may be about 5 kW. The laser energy set in step S30 is an example of "first laser energy" in the present disclosure.

The process of steps S31 to S33 are similar to those of steps S11 to S13 of FIG. 3.

In step S31, the processor 5 reads the irradiation position levels. The setting of the irradiation position levels may be similar to the example described with reference to FIG. 4.

In step S32, the processor 5 drives the actuator-equipped high reflection mirror 341 so as to adjust the irradiation position to one of the levels.

In step S33, the processor 5 generates the EUV light 252 by transmitting a trigger signal to the main pulse laser system 302 in synchronization with the passage timing signal.

In step S34, the processor 5 obtains the measurement value (EUV energy) of the EUV sensor 8 and the measurement value (return light power) of the return light sensor 332, and maps the respective measurement values in association with each level position. That is, when mapping the measurement result of the EUV energy, the processor 5 records the return light power together with the EUV energy at each irradiation position. The return light power may be an average value of a plurality of bursts. At this time, the laser light is set to a low energy value, and the laser energy condition is the same at each irradiation position.

In step S35, the processor 5 determines whether or not all the irradiation position levels included in the read irradiation position level group have been scanned. When the determination result in step S35 is NO, that is, when all the irradiation position levels have not been scanned, the processor 5 returns to step S32, causes the irradiation position to shift, and repeats steps S32 to S35. Thus, the EUV energy distribution chart with respect to the irradiation positions in the XY plane (see FIG. 9) and the return light power distribution chart (see FIG. 10) are obtained. All the above are mapped by low power laser irradiation.

When the determination result in step S35 is YES, that is, when all the irradiation position levels have been scanned, the processor 5 proceeds to step S36. When scanning of all irradiation position levels is completed, the EUV energy distribution chart as illustrated in FIG. 9 and the return light power distribution chart as illustrated in FIG. 10 are obtained. The return light power distribution chart is a map image of the association between each irradiation position and the return light power.

In step S36 of FIG. 8, the processor 5 determines a high power scanning region based on a first return light threshold. The processor 5 sets the first return light threshold for the return light power, and sets a region in which the return light power does not exceed the first return light threshold in the return light power distribution chart as a high power mapping region. The high power mapping region means a scanning region of the irradiation positions in which the EUV energy is measured while causing the irradiation position to shift by laser irradiation with laser energy higher than the low energy value set in step S30. That is, the high power mapping region is a scanning region when level scanning of the irradiation position adjustment by high power laser irradiation is performed, and may be referred to as a "high power scanning region" or an "adjustment range of laser irradiation position by high power laser irradiation."

The determination of the scanning region by the high power laser irradiation includes a concept of determining a region in which the scanning by the high power laser irradiation is prohibited, not performed, or limited, that is, determining a non-irradiation region (non-scanning region) of the high power laser irradiation.

The first return light threshold may be determined based on the laser proof strength of the optical element upstream of the amplifier 314. For example, the first return light threshold may be determined from the following equation:

First return light threshold=(Laser proof strength of optical element upstream of amplifier)×(Safety factor)×(Beam size)×(Low energy value)/(Laser energy value at exposure)

where the unit of the first return light threshold is [J], the unit of laser proof strength of optical element upstream of amplifier is [J/cm$^2$], the safety factor is a numerical value between 0 and 1 in no unit, the unit of beam size is [cm$^2$], and the unit of low energy value and laser energy value at exposure is [mJ]. The beam size may be a beam size at the optical element upstream of amplifier. The "optical element upstream of amplifier" refers to an optical element disposed upstream of the amplifier 314. The optical element upstream of amplifier is, for example, an isolator 312. The optical element upstream of amplifier may be an EO crystal of a Pockels cell.

For example, when 0.05 [mJ] is set as the first return light threshold in the return light power distribution chart illustrated in FIG. 10, the processor 5 limits the scanning by the high power laser irradiation with respect to the irradiation position level at which the return light power exceeds 0.05 [mJ]. The return light power distribution chart illustrated in FIG. 10 is an example of "first distribution data" in the present disclosure.

Figure 11:
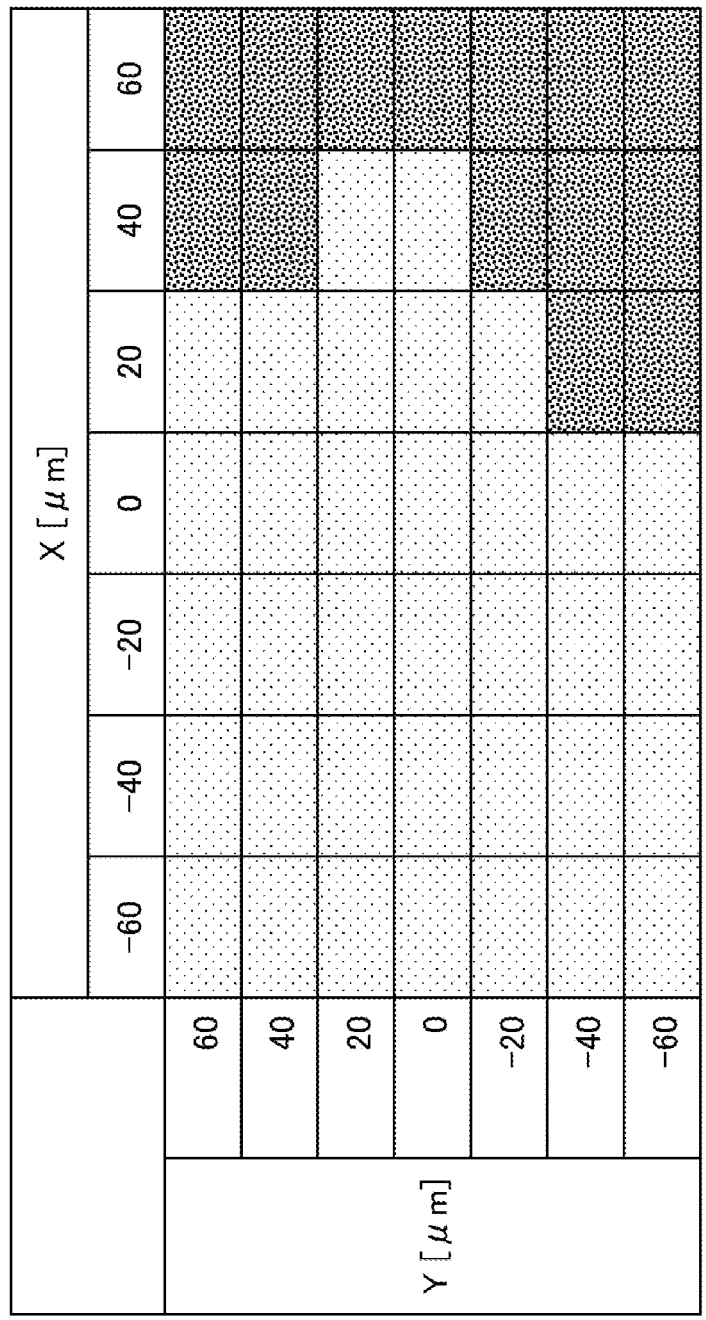
FIG. 11 illustrates an example in which a scanning region of a level is limited based on a first return light threshold.

FIG. 11 illustrates an example in which the scanning region of the level is limited based on the first return light threshold. FIG. 11 is a chart in which the scanning region and the non-scanning region by high power in the case where the first return light threshold of 0.05 [mJ] is set are separately painted with respect to the return light power distribution chart illustrated in FIG. 10.

In FIG. 10, the irradiation position where the return light power exceeding the first return light threshold 0.05 [mJ] is measured is set to the non-scanning region where the scanning of the high power laser irradiation is prohibited, and the irradiation position where the return light power not exceeding the first return light threshold 0.05 [mJ] is measured is set to the scanning region where the high power laser irradiation is to be performed. The first return light threshold is an example of the "threshold" and the "first threshold" in the present disclosure. The high power mapping region illustrated in FIG. 11 is an example of the "first region" in the present disclosure.

In step S40 of FIG. 8, the processor 5 sets the energy of the laser light to a value of the laser energy required at the time of exposure. That is, the processor 5 transmits a signal to the oscillator 310 for setting the energy of the laser light to the value of the laser energy required at the time of exposure. The value of the laser energy required at the time of exposure is an energy value higher than the low energy value set in step S30. The laser energy set in step S40 is an example of the "second laser energy" in the present disclosure.

In step S41, the processor 5 reads the irradiation position levels. The processor 5 reads the irradiation position levels in the scanning region determined in step S36, that is, the high power mapping region limited by the first return light threshold.

In step S42, the processor 5 drives the actuator-equipped high reflection mirror 341 so that the irradiation position is matched with one of the levels in the scanning region read in step S41.

In step S43, the processor 5 generates the EUV light 252 by transmitting a trigger signal to the main pulse laser system 302 in synchronization with the passage timing signal.

In step S44, the processor 5 obtains the measurement value of the EUV sensor 8 and the measurement value of the return light sensor 332, and maps the respective measurement values in association with each irradiation position (level). That is, the processor 5 creates the EUV energy distribution chart and the return light power distribution chart with laser irradiation with the laser energy value during exposure. Since the irradiation position level used is limited to the high power mapping region (see FIG. 11), the EUV energy distribution chart and the return light power distribution chart in the limited region are created. Although the return light power at each irradiation position is recorded in step S44, creation of the return light power distribution chart may be omitted.

In step S45, the processor 5 determines whether or not all irradiation position levels included in the read irradiation position level group have been scanned. When the determination result of step S45 is NO, that is, when all the read irradiation position levels have not been scanned, the processor 5 returns to step S42, causes the irradiation position to shift, and repeats steps S42 to S44. In this way, the EUV energy distribution chart limited to the high power mapping region and the return light power distribution chart are obtained (see FIGS. 12 and 13).

When the determination result of step S45 is YES, that is, when all the read irradiation position levels have been scanned, the processor 5 proceeds to step S46.

In step S46, the processor 5 selects the irradiation position (optimum position) at which high EUV energy can be realized from the obtained EUV energy distribution chart, and sets the selected irradiation position as the laser irradiation position. At this time, the irradiation position at which high EUV energy can be realized may be specified by curve fitting or the like regardless of the irradiation position level interval. For example, the irradiation position at which the EUV energy is maximized may be determined as the optimum position. When the interval between the irradiation position levels is as small as about 5 µm, the irradiation position level having higher energy may be selected as the optimum position from the EUV energy distribution chart.

Further, when there are a plurality of irradiation positions at which sufficient EUV energy for exposure can be obtained, the irradiation position at which the return light power is the lowest among them may be set as the laser irradiation position. The laser irradiation position is an example of the "target irradiation position" in the present disclosure. The processor 5 controls the actuator-equipped high reflection mirror 341 to irradiate the determined optimum position with the laser light, and drives the actuator-equipped high reflection mirror 341.

After step S46, the processor 5 ends the flowchart of FIG. 8.

Since the return light increases in correlation with the laser energy, the region of the irradiation position where the return light power reaches a dangerous level is specified by the low power mapping as described above, and the region is avoided at the time of the high power mapping.

The actuator-equipped high reflection mirror 341 is an example of the "irradiation position adjustment mechanism" and the "actuator-equipped mirror" in the present disclosure. The high reflection mirrors 342, 343, and 344 in the beam steering system 34A are examples of the "optical system" in the present disclosure. The XY plane is an example the "plane" in the present disclosure. The EUV sensor 8 is an example of the "extreme ultraviolet light sensor" in the present disclosure.

The process of steps S30 to S36 of FIG. 8 is an example of the "first measurement process" in the present disclosure. The process of steps S40 to S45 is an example of the "second measurement process" in the present disclosure. The X axis and the Y axis are examples of the "first axis" and the "second axis" in the present disclosure, and the X-axis direction and the Y-axis direction are examples of the "first direction" and the "second direction" in the present disclosure.

4.3 Examples of EUV Energy Distribution Chart and Return Light Power Distribution Chart FIG. 12 illustrates an example of an EUV energy distribution chart with high power laser irradiation. The EUV energy distribution chart illustrated in FIG. 12 is an example of "second distribution data" in the present disclosure. FIG. 13 illustrates an example of the return light power distribution chart with high power laser irradiation. In FIGS. 12 and 13, a cell in which no numerical value is recorded (a cell indicated by "-") indicates an irradiation position of a scanning region in which high power laser irradiation is prohibited.

4.4 Effect

According to the EUV light generation system 110 of the first embodiment, it is possible to specify the irradiation position at which the return light power becomes excessive, and to perform the irradiation position adjustment while avoiding the above. As a result, it is possible to reduce the risk of element damage due to the return light during the irradiation position adjustment.

5. Second Embodiment 5.1 Configuration

The configuration of the EUV light generation system 110 according to a second embodiment may be similar to that of the first embodiment illustrated in FIG. 7.

5.2 Operation

Figure 14:
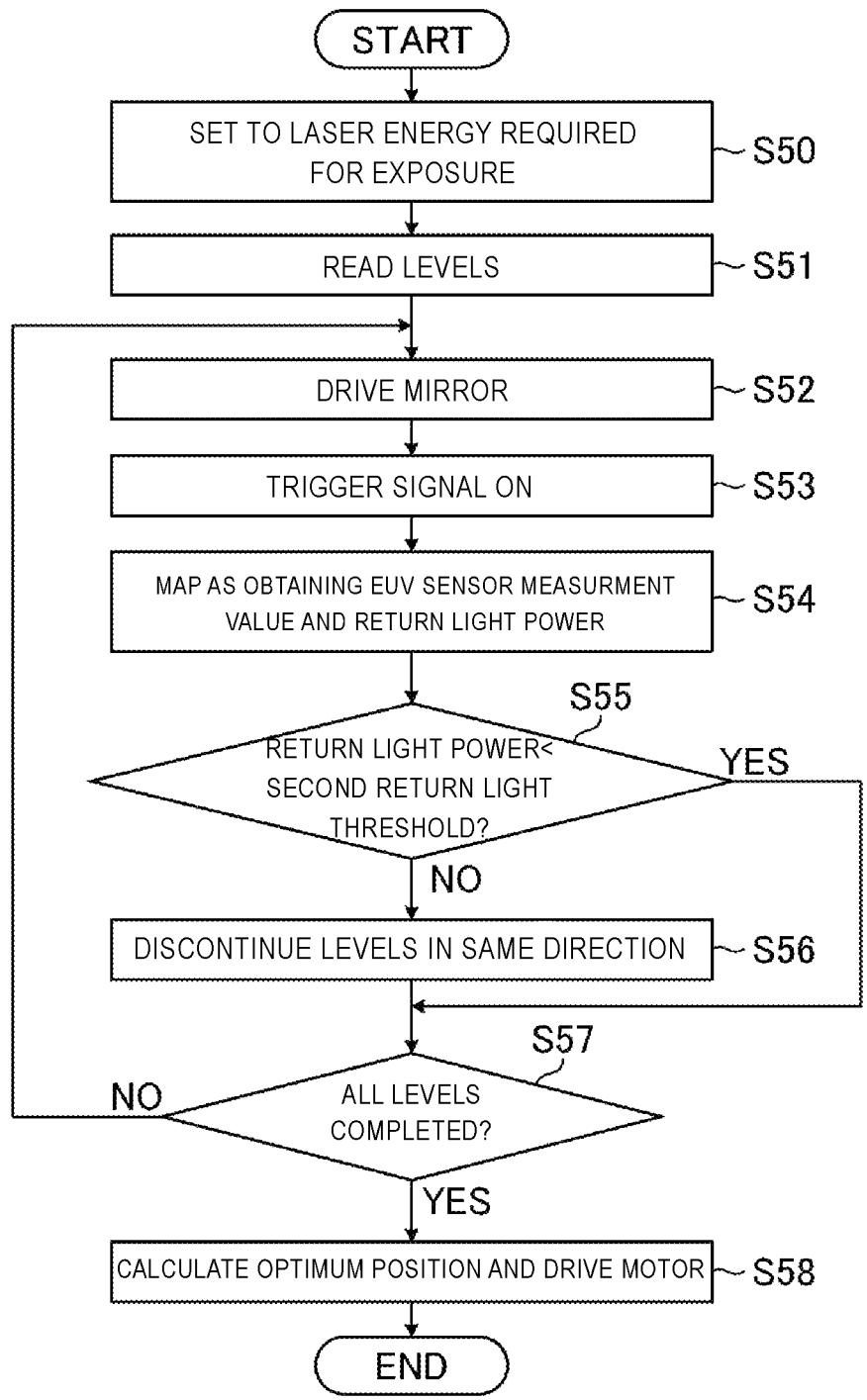
FIG. 14 is a flowchart illustrating an example of an irradiation position adjustment process of laser light in an EUV light generation system according to a second embodiment.

FIG. 14 is a flowchart illustrating an example of the irradiation position adjustment process of laser light in the EUV light generation system 110 according to the second embodiment. The flowchart described with reference to FIG. 8 is a method in which the irradiation position is adjusted by limiting the scanning region by high power laser irradiation based on the return light power distribution by low power laser irradiation.

On the other hand, in the second embodiment, a method is adopted in which scanning by high power laser irradiation is performed without performing scanning by low power laser irradiation, the return light power is monitored at that time, and the irradiation position is adjusted while limiting the scanning region by comparison with a second return light threshold.

In the second embodiment, similarly to FIG. 4, scanning may be performed by causing the irradiation position to shift in each of the X-axis direction and the Y-axis direction in accordance with the two-dimensional array of the irradiation position levels, however, instead of such a scanning method, scanning may be performed by causing the irradiation position to shift in the radial direction from the origin.

Figure 15:
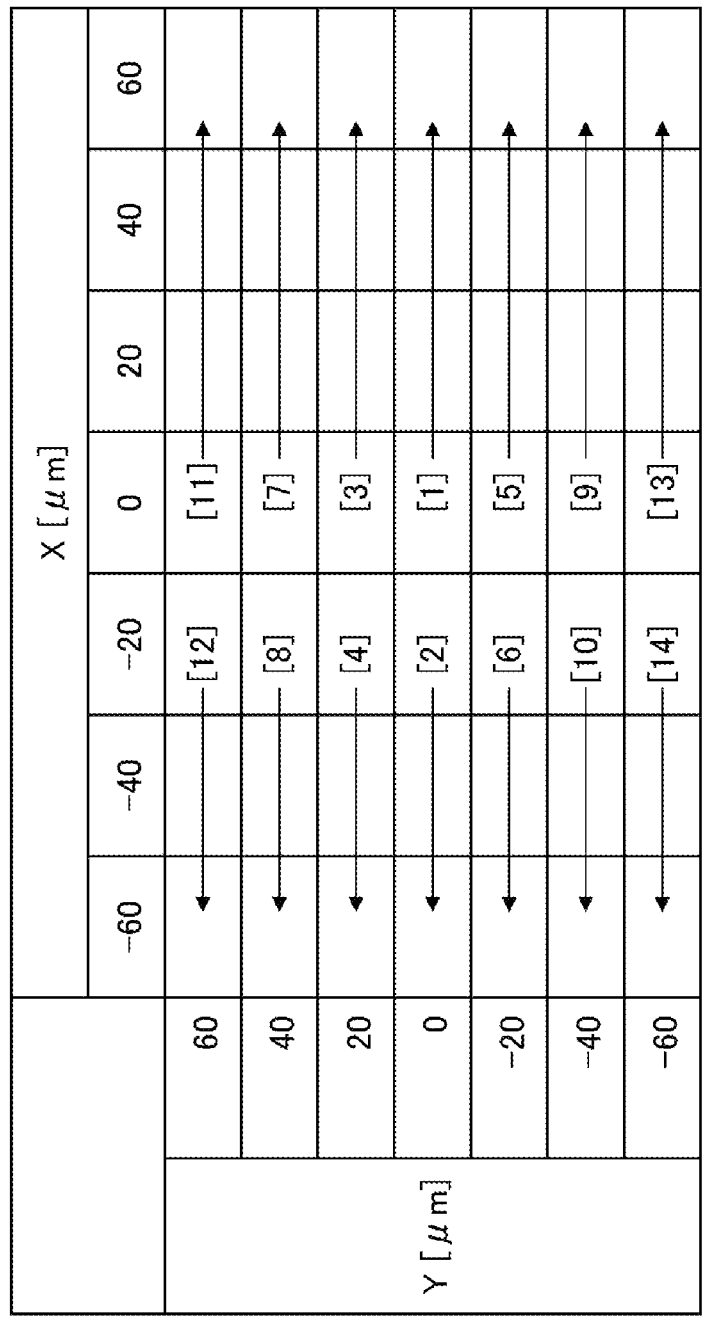
FIG. 15 illustrates an example of scanning of an irradiation position level group applied to the second embodiment.

For example, when scanning the irradiation positions Sm(x,y) with the laser light, the processor 5 performs scanning based on the irradiation position level group, for example as exemplified in FIG. 15. The ordinal numbers and arrows in FIG. 15 indicate the shift sequence of the irradiation position of laser light by scanning. For example, the processor 5 first scans from level [1], which is the origin, to the end point of the arrow, and then scans from level [2] to the end point of the arrow. By scanning in this manner, the irradiation position may be scanned so as to gradually shift away from the origin. Alternatively, the levels may be spirally scanned so as to gradually move away from the origin.

When the laser irradiation position adjustment process illustrated in FIG. 14 is started, in step S50, the processor 5 sets the energy of the laser light to the laser energy required at the time of exposure.

The processor 5 transmits, to the oscillator 310, a signal for setting the energy of the laser light to a laser energy value required at the time of exposure. Further, the processor 5 sets a second return light threshold related to the return light power. The second return light threshold may be determined based on the laser proof strength of the optical element upstream of amplifier. For example, the second return light threshold may be determined from the following equation:

Second return light threshold=(Laser proof strength of optical element upstream of amplifier)×(Safety factor)×(Beam size)

where the unit of the second return light threshold is [J], the unit of laser proof strength of optical element upstream of amplifier is [J/cm$^2$], the safety factor is a numerical value between 0 and 1 in no unit, and the unit of beam size is [cm$^2$]. The beam size may be a beam size at the optical element upstream of amplifier. The "optical element upstream of amplifier" refers to an optical element disposed upstream of the amplifier 314. The optical element upstream of amplifier is, for example, an isolator 312. The optical element upstream of amplifier may be an EO crystal of a Pockels cell.

In step S51, the processor 5 reads the irradiation position levels.

In step S52, the processor 5 drives the actuator-equipped high reflection mirror 341 so that the irradiation position of the laser light matches one of the read levels.

In step S53, the processor 5 generates the EUV light 252 by transmitting a trigger signal to the main pulse laser system 302 in synchronization with the passage timing signal.

In step S54, the processor 5 obtains the measurement value of the EUV sensor 8 and the measurement value of the return light sensor 332, and maps the respective measurement values in association with each level position. When mapping the measurement result of the EUV energy, the processor 5 records the return light power at each irradiation position and compares the return light power with the second return light threshold. Here, the "return light power" may be an average value of a plurality of bursts.

In step S55, the processor 5 determines whether or not the return light power is less than the second return light threshold. When the determination result of step S55 is YES, that is, when the return light power is less than the second return light threshold, the processor 5 proceeds to step S57.

On the other hand, when the determination result of step S55 is NO, that is, when the return light power is equal to or greater than the second return light threshold, the processor 5 proceeds to step S56.

In step S56, the processor 5 discontinues the scanning with the laser irradiation on an unirradiated level ahead in the same direction as the scanning direction on the same scanning line as the current irradiation position level. That is, when the return light power is greater than the second return light threshold, mapping is not performed for the irradiation position ahead of the level with respect to the origin and the laser light is not output. The irradiation position ahead of the level may be restated as an irradiation position on the same scanning line at a level at which irradiation is scheduled next.

As a result, the irradiation of the laser light to the irradiation position levels ahead in the same scanning direction farther from the origin than the irradiation position at which energy of the return light exceeding the second return light threshold is measured is prohibited.

After step S56, the processor 5 proceeds to step S57.

In step S57, the processor 5 determines whether or not all the irradiation position levels included in the read irradiation position level group have been completed. When the determination result of step S57 is NO, the processor 5 returns to step S52, causes the irradiation position to shift, and repeats steps S52 to S57.

As a result, the EUV energy distribution chart is obtained only in the irradiation position range in which the return light power does not significantly exceed the second return light threshold. The laser energy at this time is equivalent to that at the time of exposure.

When the determination result of step S57 is YES, the processor 5 proceeds to step S58. In step S58, the processor 5 selects the irradiation position (optimum position) at which high EUV energy can be realized from the obtained EUV energy distribution chart, and sets the selected irradiation position as the laser irradiation position. At this time, the irradiation position at which high EUV energy can be realized may be specified by curve fitting or the like regardless of the irradiation position level interval. When the interval between the irradiation position levels is as small as about 5 μm, the irradiation position level having higher energy may be selected as the optimum position.

Further, in the EUV energy distribution chart, when there are a plurality of irradiation positions at which sufficient EUV energy for exposure can be obtained, the irradiation position at which the return light power is the lowest among these irradiation positions may be set as the laser irradiation position.

As described above, in the second embodiment, high power mapping is performed by limiting the scanning region by the second return light threshold while monitoring the return light power. In the second embodiment, the low power mapping performed in the first embodiment may not be performed.

5.3 Examples of EUV Energy Distribution Chart and Return Light Power Distribution Chart 5.3.1 Example of Distribution Chart when Scanning Region of Irradiation Positions is not Limited FIGS. 16 and 17 are illustrated for comparison with FIGS. 18 and 19 to be described later. FIG. 16 is an example of an EUV energy distribution chart obtained when irradiation of laser light is performed without limiting the scanning region of the irradiation positions. FIG. 17 is an example of a return light power distribution chart obtained when irradiation of laser light is performed without limitation of the scanning region of the irradiation positions. When leveling of the irradiation positions is performed with high power laser irradiation without limiting the scanning region based on the comparison between the return light power and the second return light threshold described in the second embodiment, the EUV energy distribution chart as illustrated in FIG. 16 and the return light power distribution chart as illustrated in FIG. 17 are obtained.

5.3.2 Example of Distribution Chart when Scanning Region is Limited by Providing Threshold in Return Light Power FIGS. 18 and 19 are examples of the EUV energy distribution chart and the return light power distribution chart obtained when a threshold (second return light threshold) is provided for the return light power to limit an adjustment range at the time of high power irradiation position adjustment according to the second embodiment. FIGS. 18 and 19 illustrate an example in which the second return light threshold is set to 0.24 [mJ]. For example, in the case where the levels of the first row (Y=60 μm) in the irradiation position level group of the 7×7 matrix illustrated in FIG. 19 is sequentially scanned in the positive direction of the X axis in the scanning similar to FIG. 4, when the return light power at the irradiation position (20,60) becomes 0.25 [mJ], since this value exceeds the second return light threshold 0.24 [mJ], shifting to the irradiation positions (40,60), (60,60) ahead the irradiation position (20,60) in the same direction is discontinued.

Therefore, subsequently, shifting is performed to the irradiation position (−60,40) which is the level at the left end of the second row (Y=40 μm). Then, the levels of the second row are sequentially scanned in the positive direction of the X axis. When the return light power at the irradiation position (40,40) of the second row becomes 0.32 [mJ], since this value exceeds the second return light threshold 0.24 [mJ], shifting to the irradiation position (60,40) ahead the irradiation position (40,40) in the same direction (+X-axis direction) is discontinued. Hereinafter, the same process is performed for the third and subsequent rows, and high power mapping in which the scanning region is limited is performed as illustrated in FIGS. 18 and 19. The second return light threshold is an example of the "threshold" and the "second threshold" in the present disclosure.

5.4 Effect

According to the second embodiment, it is possible to perform the high power irradiation position adjustment while avoiding the irradiation position where the return light power becomes excessive. Thus, the irradiation position adjustment time can be shortened.

6. Third Embodiment

6.1 Configuration

Figure 20:
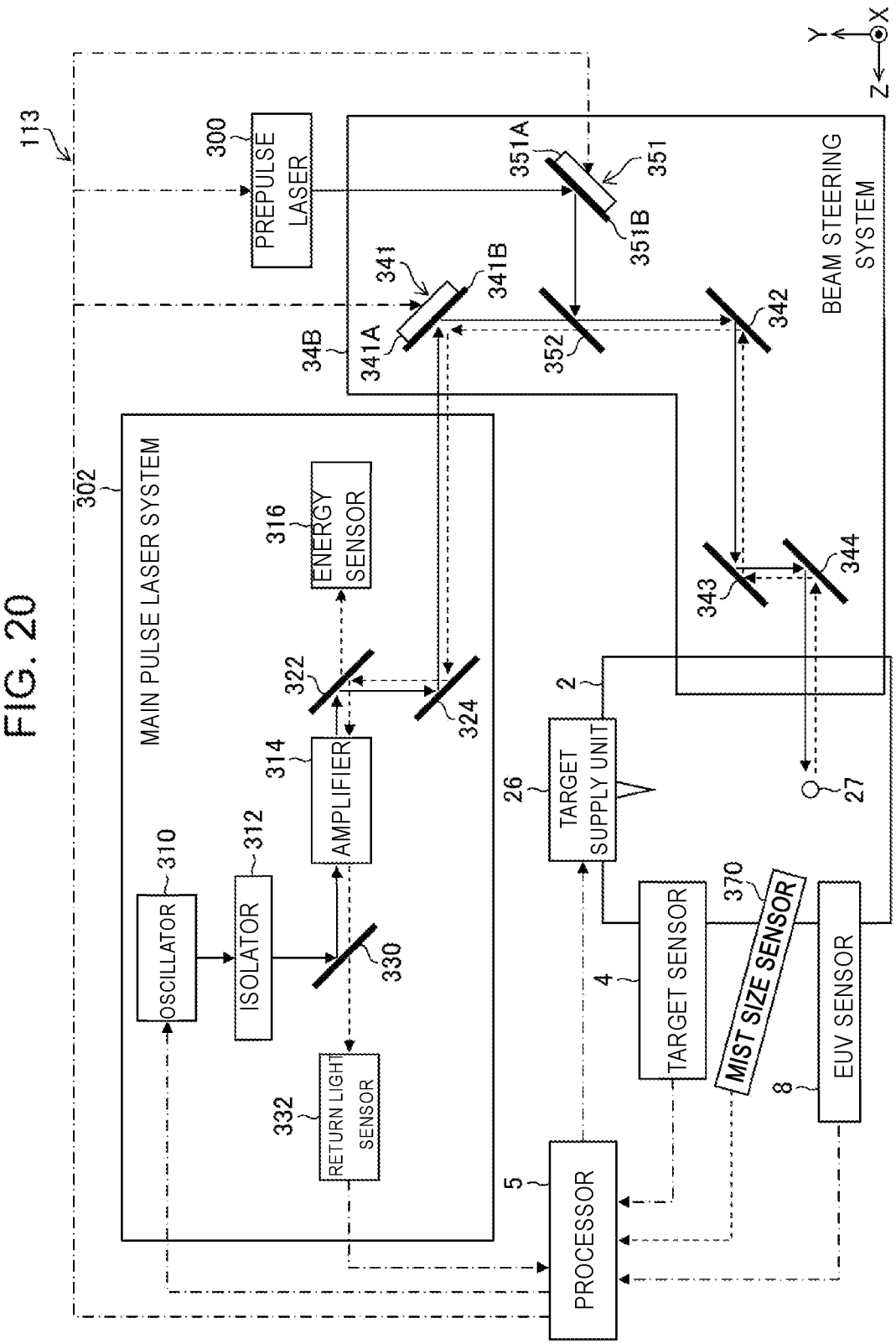
FIG. 20 schematically illustrates a configuration of an EUV light generation system according to a third embodiment.

FIG. 20 schematically illustrates a configuration of an EUV light generation system 113 according to the third embodiment. The configuration illustrated in FIG. 20 will be described in terms of differences from the configuration illustrated in FIG. 7.

The EUV light generation system 113 illustrated in FIG. 20 includes, in addition to the main pulse laser system 302, a prepulse laser 300, an actuator-equipped high reflection mirror 351, and a beam combiner 352.

The prepulse laser 300 is a laser device that emits prepulse laser light having a pulse width in the order of picoseconds [ps] or nanoseconds [ns]. The prepulse laser light may be laser light having a wavelength different from the main pulse laser light emitted from the main pulse laser system 302, and the target 27 before being irradiated with the main pulse laser light is irradiated with the prepulse laser light.

The actuator-equipped high reflection mirror 351 is included in a beam steering system 34B. The beam steering system 34B includes the actuator-equipped high reflection mirror 351 and the beam combiner 352 in addition to the configuration of the beam steering system 34A described with reference to FIG. 7.

The actuator-equipped high reflection mirror 351 is disposed on the optical path of the prepulse laser light between the prepulse laser 300 and the beam combiner 352. The actuator-equipped high reflection mirror 351 reflects the prepulse laser light toward the beam combiner 352. Similarly to the actuator-equipped high reflection mirror 341, the actuator-equipped high reflection mirror 351 includes an actuator 351A and a high reflection mirror 351B.

The high reflection mirror 351B highly reflects light having a wavelength of the prepulse laser light. The actuator-equipped high reflection mirror 351 is configured to be capable of driving the actuator 351A in response to an instruction from the processor 5 and controlling the position and/or orientation of the high reflection mirror 351B.

The beam combiner 352 is disposed at the intersection of the optical path of the reflected light from the actuator-equipped high reflection mirror 341 and the optical path of the reflected light from the actuator-equipped high reflection mirror 351. The beam combiner 352 may be, for example, a dichroic mirror that highly reflects light having a wavelength of the prepulse laser light and highly transmits light having a wavelength of the main pulse laser light.

The EUV light generation system 113 includes a mist size sensor 370 in addition to the target sensor 4 and the EUV sensor 8. The mist size sensor 370 is a camera configured to image a mist target. The mist target is a secondary target in a state in which the target 27 is atomized and diffused in space. The mist size sensor 370 is connected to the processor 5, and the processor 5 calculates the size of the mist target from the image output by the mist size sensor 370.

The main pulse laser system 302 is an example of the "main pulse laser" in the present disclosure. The actuator-equipped high reflection mirror 351 is an example of the "prepulse laser irradiation position adjustment mechanism" in the present disclosure. The actuator-equipped high reflection mirror 341 is an example of the "main pulse laser irradiation position adjustment mechanism" in the present disclosure.

6.2 Operation

The target sensor 4 detects the target 27 and outputs a passage timing signal to the processor 5.

The processor 5 adds a first delay time to the passage timing signal and outputs a prepulse light emission trigger signal to the prepulse laser 300. Further, a second delay time longer than the first delay time is added to the passage timing signal to output a main pulse light emission trigger signal to the oscillator 310 and the isolator 312 of the main pulse laser system 302.

The prepulse laser 300 emits prepulse laser light when the prepulse light emission trigger signal is input.

The oscillator 310 emits main pulse laser light when the main pulse light emission trigger signal is input, and the isolator 312 transmits the main pulse laser light in synchronization with the arrival timing of the output main pulse laser light. Prior to the above, the processor 5 sets the amplifier 314 in a state capable of amplifying the laser light.

The prepulse laser light is sequentially reflected by the actuator-equipped high reflection mirror 351, the beam combiner 352, and the high reflection mirrors 342, 343, 344, and is radiated to the target 27 in the chamber 2 to form a mist target. The mist target is imaged by a mist size sensor 370, and the processor 5 calculates the mist size. The mist size is synonymous with the "mist target size."

On the other hand, the main pulse laser light transmitted through the isolator 312 is amplified by the amplifier 314, passes through the beam steering system 34B, and is radiated to the mist target in the chamber 2.

The mist target irradiated with the main pulse laser light is turned into plasma and emits EUV light. The EUV energy emitted at this time is higher than that in the case where the prepulse laser 300 is not provided.

6.3 Example of Laser Irradiation Position Adjustment

Figure 21:
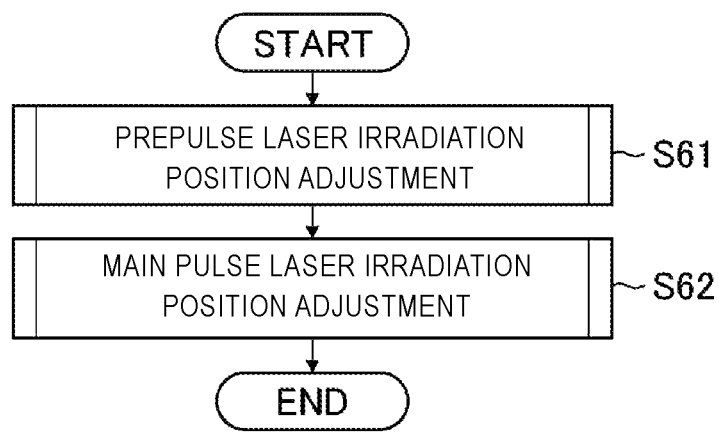
FIG. 21 is a flowchart illustrating an example of a main routine of the irradiation position adjustment process.

An example of the irradiation position adjustment process will be described with reference to FIGS. 21 and 22. FIG. 21 is a flowchart illustrating an example of a main routine of the irradiation position adjustment process.

In step S61 of FIG. 21, the processor 5 performs prepulse laser irradiation position adjustment. The prepulse laser irradiation position adjustment is a process of adjusting the irradiation position of the prepulse laser light. Thereafter, in step S62, the processor 5 performs main pulse laser irradiation position adjustment. Main pulse laser irradiation position adjustment is a process of adjusting the irradiation position of the main pulse laser light.

After step S62, the processor 5 ends the flowchart of FIG. 21.

Figure 22:
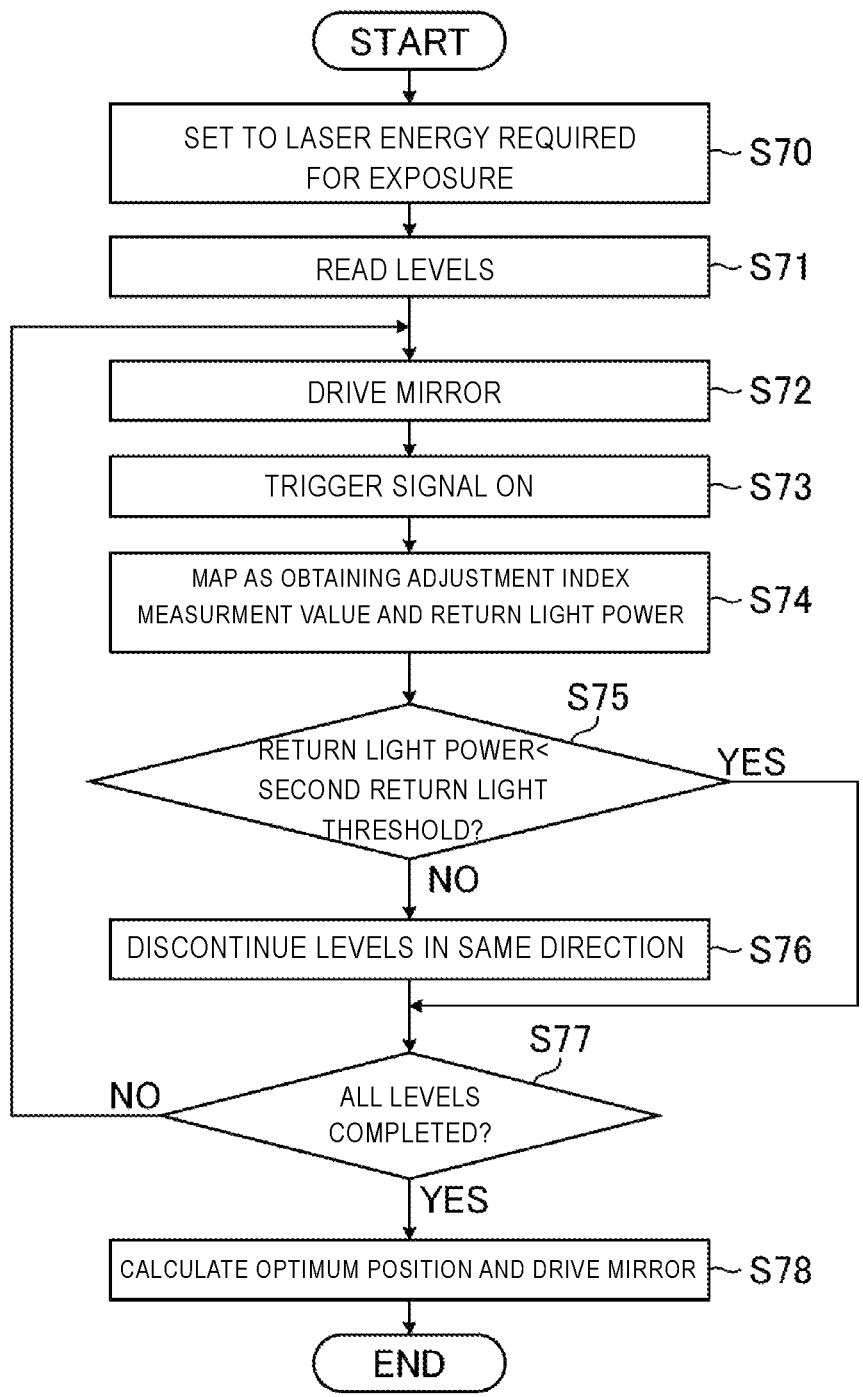
FIG. 22 is a flowchart illustrating an example of a subroutine applied to steps S61 and S62 of FIG. 21.

FIG. 22 is a flowchart illustrating an example of a subroutine applied to steps S61 and S62 of FIG. 21.

The adjustment algorithm is common to the subroutines applied to the prepulse laser irradiation position adjustment (step S61) and the main pulse laser irradiation position adjustment (step S62), and the same subroutine is applied. The return light sensor 332 detects the return light of the main pulse laser light commonly to the prepulse laser irradiation position adjustment and the main pulse laser irradiation position adjustment.

The difference between the prepulse laser irradiation position adjustment and the main pulse laser irradiation position adjustment is an adjustment index for creating a distribution chart, a level list (irradiation position level group), and a drive mirror. The main pulse laser irradiation position adjustment is different in that the adjustment index thereof is the EUV energy while the adjustment index in the prepulse laser irradiation position adjustment is the mist size of the mist target.

The prepulse laser irradiation position adjustment and the main pulse laser irradiation position adjustment may have different adjustment ranges and adjustment step widths. That is, different level groups may be employed in the irradiation position level group applied to the prepulse laser irradiation position adjustment and the irradiation position level group applied to the main pulse laser irradiation position adjustment.

The mirror to be moved as an adjustment target in the main pulse laser irradiation position adjustment is the high reflection mirror 341 while the mirror to be moved as an adjustment target in the prepulse laser irradiation position adjustment is the high reflection mirror 351B. Only the adjustment targets are moved independently in the prepulse laser irradiation position adjustment and the main pulse laser irradiation position adjustment, respectively.

For example, the irradiation position of the main pulse laser light is fixed during the the prepulse laser light irradiation position adjustment, and the irradiation position of the prepulse laser light is fixed during the main pulse laser light irradiation position adjustment.

FIG. 22 illustrates the method, as an example of the laser irradiation position adjustment algorithm, similar to that described in the second embodiment, but the method described in the first embodiment may be applied. Further, the flowchart illustrated in FIG. 22 may be repeated a plurality of times, and the process of the prepulse laser irradiation position adjustment and the process of the main pulse laser irradiation position adjustment may be performed in an appropriate order and in an appropriate combination.

6.3.1 Prepulse Laser Irradiation Position Adjustment

The processor 5 operates as follows by applying the subroutine illustrated in FIG. 22 when adjusting the prepulse laser irradiation position.

In step S70, the processor 5 transmits a signal, to the oscillator 310, for setting the energy of the main pulse laser light to the main pulse laser energy value required at the time of exposure. The processor 5 sets the second return light threshold as the threshold of the return light power. The second return light threshold may be determined similarly to the second embodiment.

In step S71, the processor 5 reads the irradiation position levels of the prepulse laser light.

In step S72, the processor 5 drives the actuator-equipped high reflection mirror 351 so that the irradiation position of the prepulse laser light matches one of the read levels.

In step S73, the processor 5 transmits a trigger signal to each of the prepulse laser 300 and the main pulse laser system 302 in synchronization with the passage timing signal, thereby generating the EUV light 252.

In step S74, the processor 5 obtains the measurement value of the adjustment index and the measurement value (return light power) of the return light sensor 332, and maps respective measurement values in association with each level position. The "adjustment index" in the prepulse laser irradiation position adjustment is the mist size, and when mapping the measurement results of the mist size, the processor 5 records the return light power at each irradiation position and compares the return light power with the second return light threshold. Here, the "return light power" may be an average value of a plurality of bursts.

In step S75, the processor 5 determines whether or not the return light power is less than the second return light threshold. When the determination result of step S75 is YES, that is, when the return light power is less than the second return light threshold, the processor 5 proceeds to step S77.

On the other hand, when the determination result of step S75 is NO, that is, when the return light power becomes equal to or larger than the second return light threshold, the processor 5 proceeds to step S76.

In step S76, the processor 5 discontinues the scanning on the unirradiated level ahead in the same direction as the scanning direction on the same scanning line as the current irradiation position level. That is, when the return light power is greater than the second return light threshold, mapping is not performed for the irradiation position ahead of the level (far from the origin) with respect to the origin, and the prepulse laser light and the main pulse laser light are not output.

After step S76, the processor 5 proceeds to step S77.

In step S77, the processor 5 determines whether or not all the irradiation position levels included in the read irradiation position level group have been completed. When the determination result of step S77 is NO, that is, when all the irradiation position levels have not been completed, the processor 5 returns to step S72, causes the irradiation position to shift, and repeats steps S72 to S77.

As a result, the mist size distribution chart is obtained only in the irradiation position range in which the return light power does not significantly exceed the second return light threshold. The energy of the main pulse laser light at this time is equivalent to that at the time of exposure.

When the determination result of step S77 is YES, that is, when all the irradiation position levels are completed, the processor 5 proceeds to step S78. In step S78, the processor 5 selects the prepulse laser irradiation position (optimum position) at which a large mist size can be realized from the obtained mist size distribution chart, and sets the selected irradiation position as the prepulse laser irradiation position. At this time, the irradiation position at which a large mist size can be realized may be specified by curve fitting or the like regardless of the irradiation position level interval. For example, the irradiation position at which the mist size is maximized may be determined as the prepulse laser irradiation position. When the interval between the irradiation position levels is as small as about 5 µm, the irradiation position level having a larger mist size may be set as the prepulse laser irradiation position.

Further, in the mist size distribution chart, when there are a plurality of irradiation positions at which a sufficient mist size can be obtained, the irradiation position at which the return light power is the lowest among these irradiation positions may be set as the prepulse laser irradiation position. The irradiation position (optimum position) set as the prepulse laser irradiation position is an example of the "first target irradiation position" in the present disclosure.

6.3.2 Main Pulse Laser Irradiation Position Adjustment

When adjusting the main pulse laser irradiation position, the processor 5 applies the subroutine illustrated in FIG. 22 and performs steps similar to steps S70 to S78.

The difference of the main pulse laser irradiation position adjustment from the prepulse laser irradiation position adjustment is that the mirror to be driven in step S72 is the actuator-equipped high reflection mirror 341, and therefore, that the levels to be read in step S71 are the irradiation position levels of the main pulse laser light. The adjustment index in step S74 is EUV energy.

That is, instead of the mist size mapping in the prepulse laser irradiation position adjustment, as in the second embodiment, EUV energy mapping is performed on the main pulse laser light to determine the main pulse laser irradiation position. In the course of the EUV energy mapping on the main pulse laser light, the actuator-equipped high reflection mirror 341 is driven to scan the irradiation positions only by the main pulse laser light. The actuator-equipped high reflection mirror 351 disposed on the optical path of the prepulse laser light is not driven, and the irradiation position of the prepulse laser light is held at the optimum position (prepulse laser irradiation position) obtained in the step of adjusting the prepulse laser irradiation position.

The irradiation position (optimum position) set as the main pulse irradiation position by the process of the main pulse laser irradiation position adjustment is an example of the "second target irradiation position" in the present disclosure.

As described above, when one target 27 is irradiated with a plurality of beams of laser light, the irradiation positions of the beams of laser light are sequentially adjusted. At this time, it is desirable to provide an actuator for individually adjusting the irradiation position of each beam of laser light. However, a single actuator may be used to adjust the plurality of beams of laser light having close irradiation positions or irradiation timings.

6.4 Effect

According to the third embodiment, in the EUV light generation system 113 that irradiates one target 27 with a plurality of beams of laser light, it is possible to reduce the risk of element damage due to the return light during irradiation position adjustment.

Figure 23:
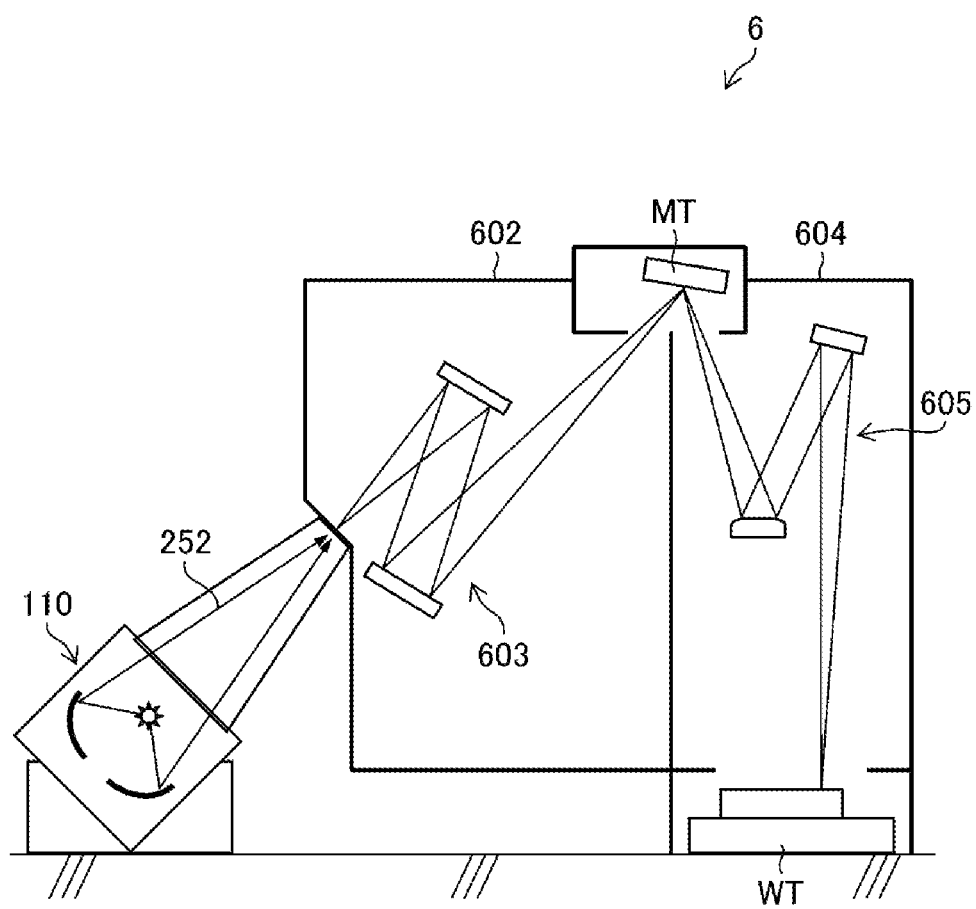
FIG. 23 schematically illustrates a configuration of an exposure apparatus connected to an EUV light generation system.

7. Example of Electronic Device Manufacturing Method Using EUV Light Generation System FIG. 23 schematically illustrates a configuration of the exposure apparatus 6 connected to the EUV light generation system 110. In FIG. 23, the exposure apparatus 6 includes a mask irradiation unit 602 and a workpiece irradiation unit 604. The mask irradiation unit 602 illuminates, via a reflection optical system 603, a mask pattern of a mask (not illustrated) disposed on a mask table MT with the EUV light 252 incident from the EUV light generation system 110. The workpiece irradiation unit 604 images the EUV light reflected by the mask table MT onto a workpiece (not illustrated) disposed on the workpiece table WT via a reflection optical system 605. The workpiece is a photosensitive substrate such as a semiconductor wafer on which photoresist is applied. The exposure apparatus 6 synchronously translates the mask table MT and the workpiece table WT to expose the workpiece to the EUV light reflecting the mask pattern. After the mask pattern is transferred onto the semiconductor wafer by the exposure process described above, the semiconductor device can be manufactured through a plurality of processes. The semiconductor device is an example of an "electronic device" in the present disclosure. The EUV light generation system 113 may be used instead of the EUV light generation system 110.

8. Others

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. An extreme ultraviolet light generation system, comprising:
   a chamber;
   a target supply unit configured to supply a target to a predetermined region in the chamber;
   a laser device configured to emit laser light to be radiated to the target;
   an optical system which forms a laser light path for guiding the laser light to the predetermined region;
   an irradiation position adjustment mechanism configured to adjust an irradiation position of the laser light with respect to the target in a plane being perpendicular to an optical path axis of the laser light traveling toward the predetermined region and intersecting the predetermined region;

an extreme ultraviolet light sensor configured to measure energy of extreme ultraviolet light generated by irradiating the target with the laser light;

a return light sensor configured to measure energy of return light traveling backward on the laser light path among reflected light of the laser light by the target; and a processor configured to control the irradiation position adjustment mechanism, the processor storing measurement results of the extreme ultraviolet light energy measured by the extreme ultraviolet light sensor and the return light energy measured by the return light sensor in association with each of the irradiation positions as causing the irradiation position to shift in the plane and causing the laser light to be radiated to the irradiation position, limiting a shift region of the irradiation position based on comparison between the return light energy and a threshold, determining a target irradiation position based on the stored association between the irradiation position and the extreme ultraviolet light energy in a region where the return light energy does not exceed the threshold, and controlling the irradiation position adjustment mechanism in accordance with the target irradiation position.

2. The extreme ultraviolet light generation system according to claim 1, wherein the processor specifies the region where the return light energy does not exceed the threshold based on the stored association between the return light energy and the irradiation position, and limits shifting of the irradiation position into a region where the return light energy exceeds the threshold.

3. The extreme ultraviolet light generation system according to claim 1, wherein the processor performs:

a first measurement process of setting energy of the laser light emitted from the laser device to first laser energy and storing, in association with the irradiation position, measurement results of the extreme ultraviolet light energy and the return light energy due to irradiation of the laser light set to the first laser energy;

a process of specifying, as a first region, a region where the return light energy does not exceed a first threshold as the threshold based on first distribution data indicating the association between the return light energy and the irradiation position stored in the first measurement process;

a second measurement process of setting energy of the laser light emitted from the laser device to second laser energy higher than the first laser energy, shifting the irradiation position of the laser light in the first region, and storing, in association with each of the irradiation positions in the first region, measurement results of the extreme ultraviolet light energy and the return light energy with the laser light set to the second laser energy radiated to the irradiation position; and a process of determining the target irradiation position based on second distribution data indicating association between the extreme ultraviolet light energy and the irradiation position stored in the second measurement process.

4. The extreme ultraviolet light generation system according to claim 3, wherein the first laser energy is between 25% and 30% of the second laser energy.

5. The extreme ultraviolet light generation system according to claim 3, wherein the second laser energy is equivalent to energy of the laser light set for generating the extreme ultraviolet light for exposure in an exposure apparatus.

6. The extreme ultraviolet light generation system according to claim 1, wherein the processor sets irradiation position levels defining a plurality of the irradiation positions for each axis direction of a first axis and a second axis perpendicular to each other in the plane, and controls the irradiation position adjustment mechanism so that the irradiation position shifts in accordance with the irradiation position levels.

7. The extreme ultraviolet light generation system according to claim 6, wherein the processor controls the irradiation position adjustment mechanism so that the irradiation position shifts in a second direction along the second axis after the irradiation position shifts in a first direction along the first axis in accordance with the irradiation position levels.

8. The extreme ultraviolet light generation system according to claim 1, wherein the laser device includes an oscillator and an amplifier, and the return light sensor receives the return light having passed through the amplifier.

9. The extreme ultraviolet light generation system according to claim 1, wherein the irradiation position adjustment mechanism includes an actuator-equipped mirror disposed on the laser light path.

10. The extreme ultraviolet light generation system according to claim 1, wherein the processor determines an irradiation position where the extreme ultraviolet light energy is maximized as the target irradiation position.

11. The extreme ultraviolet light generation system according to claim 1, wherein, when the return light energy exceeds the threshold, the processor controls the irradiation position adjustment mechanism to limit the shifting to the irradiation position which is farther from an origin in the plane than the irradiation position where the return light energy exceeding the threshold is measured.

12. The extreme ultraviolet light generation system according to claim 1, wherein the processor sets energy of laser light emitted from the laser device to second laser energy equivalent to energy of the laser light set for generating the extreme ultraviolet light for exposure in an exposure apparatus, stores measurement results of the extreme ultraviolet light energy and the return light energy due to irradiation of the laser light set to the second laser energy in association with the irradiation position, and limits the shift region based on comparison between the measurement result of the return light energy and a second threshold as the threshold.

13. The extreme ultraviolet light generation system according to claim 12, wherein the second threshold is a threshold defined for the return light energy due to irradiation of the laser light set to the second laser energy.

14. An extreme ultraviolet light generation system according to claim 12,
wherein the processor sets irradiation position levels defining a plurality of the irradiation positions for each axis direction of a first axis and a second axis perpendicular to each other in the plane with an origin defined in the plane as a center, and
controls the irradiation position adjustment mechanism to scan the irradiation positions in accordance with the irradiation position levels in a manner of gradually shifting apart from the origin.

15. The extreme ultraviolet light generation system according to claim 14,
wherein the processor performs scanning in which the irradiation position sequentially shifts in a scanning direction in accordance with the irradiation position levels being a two-dimensional array in the plane, compares the return light energy with the second threshold at each irradiation position during scanning, and prohibits irradiation of the laser light to the irradiation position levels ahead in the same scanning direction farther from the origin than the irradiation position where the return light energy exceeding the second threshold is measured.

16. The extreme ultraviolet light generating system according to claim 1,
wherein the laser device includes a prepulse laser configured to emit prepulse laser light, and a main pulse laser configured to emit main pulse laser light,
the irradiation position adjustment mechanism includes a prepulse laser irradiation position adjustment mechanism configured to adjust an irradiation position of the prepulse laser light, and a main pulse laser irradiation position adjustment mechanism configured to adjust an irradiation position of the main pulse laser light, and
the optical system includes a beam combiner disposed at an intersection between an optical path of the prepulse laser light and an optical path of the main pulse laser light.

17. The extreme ultraviolet light generation system according to claim 16, further comprising a mist size sensor configured to image a mist target generated by irradiating the target with the prepulse laser light,
wherein the processor stores a mist target size measured using the mist size sensor in association with the irradiation position.

18. The extreme ultraviolet light generating system according to claim 16,
wherein the processor performs
a process of prepulse laser irradiation position adjustment to adjust the irradiation position of the prepulse laser light to a first target irradiation position by controlling the prepulse laser irradiation position adjustment mechanism, and
a process of main pulse laser irradiation position adjustment to adjust the irradiation position of the main pulse laser light to a second target irradiation position by controlling the main pulse irradiation position adjustment mechanism.

19. The extreme ultraviolet light generation system according to claim 16,
wherein the processor adjusts the irradiation position of the prepulse laser light to an optimum position by controlling the prepulse laser irradiation position adjustment mechanism, and then, adjusts the irradiation position of the main pulse laser light by controlling the main pulse laser irradiation position adjustment mechanism.

20. An electronic device manufacturing method, comprising:
generating extreme ultraviolet light using an extreme ultraviolet light generation system;
emitting the extreme ultraviolet light to an exposure apparatus; and
exposing a photosensitive substrate to the extreme ultraviolet light in the exposure apparatus to manufacture an electronic device,
the extreme ultraviolet light generation system including:
a chamber;
a target supply unit configured to supply a target to a predetermined region in the chamber;
a laser device configured to emit laser light to be radiated to the target;
an optical system which forms a laser light path for guiding the laser light to the predetermined region;
an irradiation position adjustment mechanism configured to adjust an irradiation position of the laser light with respect to the target in a plane being perpendicular to an optical path axis of the laser light traveling toward the predetermined region and intersecting the predetermined region;
an extreme ultraviolet light sensor configured to measure energy of extreme ultraviolet light generated by irradiating the target with the laser light;
a return light sensor configured to measure energy of return light traveling backward on the laser light path among reflected light of the laser light by the target; and
a processor configured to control the irradiation position adjustment mechanism,
the processor storing measurement results of the extreme ultraviolet light energy measured by the extreme ultraviolet light sensor and the return light energy measured by the return light sensor in association with each of the irradiation positions as causing the irradiation position to shift in the plane and causing the laser light to be radiated to the irradiation position, limiting a shift region of the irradiation position based on comparison between the return light energy and a threshold, determining a target irradiation position based on the stored association between the irradiation position and the extreme ultraviolet light energy in a region where the return light energy does not exceed the threshold, and controlling the irradiation position adjustment mechanism in accordance with the target irradiation position.

* * * * *